US010447005B2

(12) United States Patent
Yamanaka et al.

(10) Patent No.: US 10,447,005 B2
(45) Date of Patent: Oct. 15, 2019

(54) LIGHT SOURCE DEVICE

(71) Applicant: PANASONIC INTELLECTUAL PROPERTY MANAGEMENT CO., LTD., Osaka (JP)

(72) Inventors: Kazuhiko Yamanaka, Osaka (JP); Kiyoshi Morimoto, Osaka (JP); Hideki Kasugai, Shiga (JP); Kazuyuki Matsumura, Osaka (JP); Hideo Yamaguchi, Fukuoka (JP); Nobuyasu Suzuki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/950,846

(22) Filed: Apr. 11, 2018

(65) Prior Publication Data
US 2018/0235040 A1 Aug. 16, 2018

Related U.S. Application Data

(63) Continuation of application No. PCT/JP2016/004587, filed on Oct. 14, 2016.

(30) Foreign Application Priority Data

Oct. 20, 2015 (JP) ................. 2015-206677

(51) Int. Cl.
*H01S 5/00* (2006.01)
*H01S 5/024* (2006.01)
(Continued)

(52) U.S. Cl.
CPC ...... *H01S 5/02469* (2013.01); *G02B 19/0014* (2013.01); *G02B 19/0028* (2013.01);
(Continued)

(58) Field of Classification Search
CPC ........ H01S 5/02469; H01S 5/005; H01S 5/02; H01S 5/02212; H01S 5/02208; H01S 5/02236; H01S 5/024; H01S 5/02476
See application file for complete search history.

(56) References Cited

U.S. PATENT DOCUMENTS

| 4,737,011 A | 4/1988 | Iri et al. |
| 2002/0018500 A1 | 2/2002 | Aikiyo et al. |
(Continued)

FOREIGN PATENT DOCUMENTS

| JP | 02-136205 U | 11/1990 |
| JP | 02-142563 U | 12/1990 |
(Continued)

OTHER PUBLICATIONS

International Search Report (ISR) and Written Opinion dated Nov. 22, 2016 in International (PCT) Application No. PCT/JP2016/004587; with partial English translation.
(Continued)

*Primary Examiner* — Kinam Park
(74) *Attorney, Agent, or Firm* — McDermott Will & Emery LLP

(57) ABSTRACT

A light source device includes: a semiconductor light-emitting device including a flat-shaped base having a first main surface on a first side and a second main surface and a semiconductor light-emitting element disposed on the first side; a first fixing component having a first through-hole and a first pressing surface that presses the first main surface; and a second fixing component having a second through-hole and a second pressing surface that presses the second main surface. The base is fixed between the first and second pressing surfaces by an engagement between a first inner surface surrounding the first through-hole of the first fixing component and a second outer surface of the second fixing component. A distance between the first and second pressing (Continued)

surfaces is smaller than or equal to a thickness of the base, and a void is formed lateral to the base between the first and second pressing surfaces.

20 Claims, 21 Drawing Sheets

(51) Int. Cl.
  *H01S 5/022* (2006.01)
  *G02B 19/00* (2006.01)
  *H01S 5/02* (2006.01)
(52) U.S. Cl.
  CPC .......... *G02B 19/0052* (2013.01); *H01S 5/024* (2013.01); *H01S 5/02208* (2013.01); *H01S 5/02236* (2013.01); *H01S 5/02296* (2013.01); *H01S 5/02476* (2013.01); *H01S 5/005* (2013.01); *H01S 5/02* (2013.01); *H01S 5/02212* (2013.01)

(56) References Cited

U.S. PATENT DOCUMENTS

| | | | |
|---|---|---|---|
| 2005/0226636 A1* | 10/2005 | Hiramatsu | H01S 5/02228 398/182 |
| 2007/0263678 A1 | 11/2007 | Mizuuchi et al. | |
| 2008/0074751 A1* | 3/2008 | Steffen | G02B 7/023 359/641 |
| 2009/0290608 A1 | 11/2009 | Kim | |
| 2013/0259075 A1 | 10/2013 | Okumura | |
| 2014/0160782 A1 | 6/2014 | Harada | |
| 2014/0198509 A1* | 7/2014 | Takiguchi | H01S 5/02 362/382 |
| 2016/0344159 A1* | 11/2016 | Sherrer | G02B 6/4201 |

FOREIGN PATENT DOCUMENTS

| | | |
|---|---|---|
| JP | 04-151612 A | 5/1992 |
| JP | 06-291418 A | 10/1994 |
| JP | 2001-358398 A | 12/2001 |
| JP | 2006-237103 A | 9/2006 |
| JP | 2008-294259 A | 12/2008 |
| JP | 2013-197256 A | 9/2013 |
| JP | 2014-138116 A | 7/2014 |
| JP | 2014-146668 A | 8/2014 |
| WO | 2005/088787 A1 | 9/2005 |
| WO | 2012/093637 A1 | 7/2012 |

OTHER PUBLICATIONS

Chinese Office Action and Search Report dated Aug. 26, 2019 issued in corresponding Chinese Patent Application No. 201680059866.7; with English translation of the Search Report.

* cited by examiner

FIG. 3

| MATERIAL | MATERIAL NAME (JIS) | MODULUS OF LONGITUDINAL ELASTICITY (kN/mm²) | YIELD POINT (N/mm²) | PROOF STRESS (N/mm²) | THERMAL CONDUCTIVITY (W/m/K) | SPECIFIC HEAT (J/g/K) |
|---|---|---|---|---|---|---|
| ALUMINUM OR ALUMINUM ALLOY | A1050 | 69 | – | 34 | 230 | 0.92 |
| | A5052 | 71 | – | 220 | 140 | 0.96 |
| | A6063 | 69 | – | 150 | 210 | 0.96 |
| | ADC12 | 71 | – | 150 | 96 | 0.96 |
| ZINC OR ZINC ALLOY | ZDC2 | 90 | – | 180 | 110 | 0.42 |
| COPPER | C1020 | 100 | – | 83 | 390 | 0.39 |
| IRON STEEL | SS400 | 206 | 280 | – | 52 | 0.48 |
| | S45C | 205 | 490 | – | 43 | 0.44 |
| | SPC | 205 | 220 | – | 79 | 0.42 |
| STAINLESS STEEL | SUS430 | 200 | 205 | – | 26 | 0.46 |
| | SUS304 | 197 | 205 | – | 14 | 0.5 |

LIGHT SOURCE DEVICE

CROSS REFERENCE TO RELATED APPLICATIONS

This application is a U.S. continuation application of PCT International Patent Application Number PCT/JP2016/004587 filed on Oct. 14, 2016, claiming the benefit of priority of Japanese Patent Application Number 2015-206677 filed on Oct. 20, 2015, the entire contents of which are hereby incorporated by reference.

BACKGROUND

1. Technical Field

The present disclosure relates to light source devices, and particularly to a light source device which includes a semiconductor light-emitting device and is used for, for example, a projection display device, vehicle lighting, and facility lighting.

2. Description of the Related Art

A light source device which includes a semiconductor light-emitting device packaged with a semiconductor light-emitting element, such as a semiconductor laser, is known as an example of a conventional light source device (see Japanese Unexamined Patent Application Publication No. 2001-358398, for example). Such a light source device needs to efficiently dissipate heat, which is generated by the semiconductor light-emitting element, to the outside of the light source device. A conventional light source device is described with reference to the drawing as follows. FIG. 26 is a schematic cross-sectional view showing a configuration of conventional light source device 1030.

Conventional light source device (semiconductor laser module) 1030 shown in FIG. 26 includes semiconductor laser device (semiconductor laser element unit) 1010 provided with semiconductor laser element 1011.

Semiconductor laser device 1010 includes semiconductor laser element 1011 which is mounted, via submount 1012, on element fixing block 1013 located on base 1014 and which is hermetically sealed by cap 1015. To be more specific, semiconductor laser device 1010 has a so-called transistor outlined CAN (TO-CAN) type packaging. Semiconductor laser device 1010 is fixed, by an adhesive material, to package supporting portion 1031*b* of fixing component 1031 having an L-shape in cross section.

Semiconductor laser element 1011 of semiconductor laser device 1010 is supplied with electric power from lead pin 1017 formed in base 1014. Then, light from semiconductor laser element 1011 is emitted from a transparent window of cap 1015. Here, heat generated by semiconductor laser element 1011 is transferred through a thermal dissipation path formed by submount 1012, element fixing block 1013, and base 1014. Then, the heat is transferred from base portion 1031*a* of fixing component 1031 to a Peltier element.

Conventional light source device 1030 described above includes the thermal dissipation path formed by submount 1012, element fixing block 1013, and base 1014 that are formed using materials that are high in thermal conductivity. Moreover, a bottom surface of base 1014 is in contact with fixing component 1031. For these reasons, thermal dissipation performance of conventional light source device 1030 can be enhanced.

SUMMARY

Suppose that conventional light source device 1030 described above includes, as semiconductor laser element 1011, a high-power element to be injected with high current or an element that generates a large amount of heat, such as a nitride semiconductor element having a high operating voltage. In this case, due to a lack of the thermal dissipation performance of semiconductor laser device 1010, temperature increase of semiconductor laser element 1011 cannot be suppressed. In particular, when a package of semiconductor laser device 1010 has a versatile shape, the thermal capacity of the package is small and the thermal dissipation area of the package to dissipate heat to the outside is also small. Thus, the temperature of semiconductor laser element 1011 easily increases.

The present disclosure is conceived to solve the aforementioned problem and has an object to provide a light source device that is capable of efficiently dissipating heat generated by a semiconductor light-emitting device.

To achieve the aforementioned object, a light source device according to an aspect of the present disclosure includes: a semiconductor light-emitting device which includes (i) a base that is in a shape of a flat plate and has a first main surface on a first side and a second main surface on a second side opposite to the first main surface, and (ii) a semiconductor light-emitting element that is disposed on the first side and thermally connected to the base; a first fixing component which has (i) a first pressing surface that presses the first main surface toward the second main surface and (ii) a first through-hole passing through the first fixing component in a direction that crosses the first main surface; and a second fixing component which has (i) a second pressing surface that presses the second main surface toward the first main surface and (ii) a second through-hole passing through the second fixing component in a direction that crosses the second main surface. The base is fixed between the first pressing surface and the second pressing surface by one of (i) an engagement, on the second side, between a first inner surface surrounding the first through-hole of the first fixing component and a second outer surface of the second fixing component and (ii) an engagement, on the first side, between a second inner surface surrounding the second through-hole of the second fixing component and a first outer surface of the first fixing component. A distance between the first pressing surface and the second pressing surface is smaller than or equal to a thickness of the base, and a void is formed lateral to the base between the first pressing surface and the second pressing surface.

With this configuration, the base can be fixed by the adequate pressure of the first fixing component and the second fixing component. This can enhance the adhesion between the base and the first fixing component and between the base and the second fixing component. Moreover, the engagement between the first fixing component and the second fixing component allows the thermal resistance between the first fixing component and the second fixing component to be low. Thus, heat can be dissipated efficiently to one of the first fixing component and the second fixing component that has a larger thermal capacity. The heat generated by the semiconductor light-emitting device can be efficiently dissipated from both of the main surfaces of the base. More specifically, this configuration can provide an adequate path for thermal dissipation from the semiconductor light-emitting device.

Moreover, in a light source device according to an aspect of the present disclosure, a perimeter of the first fixing component may be encompassed by a perimeter of the second fixing component in a plan view of the first main surface.

With this configuration, the thermal capacity of the second fixing component is allowed to be larger than that of the first fixing component. Thus, the heat transferred to the first fixing component is transferred to the second fixing component to achieve efficient thermal dissipation.

Furthermore, in a light source device according to an aspect of the present disclosure, a contact portion between the first fixing component and the second fixing component may be in parallel with a direction that crosses the first main surface of the base.

With this configuration, the contact portion can be provided between the first fixing component and the second fixing component without hindering the distance between the first pressing surface and the second pressing surface from becoming smaller than the thickness of the base. In this way, the light source device according to the present disclosure has a configuration in which the base is applied with adequate pressure by the first pressing surface and the second pressing surface. This configuration can reduce the thermal resistance between the base and the first fixing component and between the base and the second fixing component.

Moreover, in a light source device according to an aspect of the present disclosure, one of the first fixing component and the second fixing component may include a male thread portion, the other one of the first fixing component and the second fixing component may include a female thread portion, and the male thread portion and the female thread portion may engage with each other.

With this configuration, the threadable engagement between the first fixing component and the second fixing component allows pressure to be applied to the base. Thus, while the contact portion is provided between the first fixing component and the second fixing component, the base can be applied with pressure by the first fixing component and the second fixing component. This can enhance the adhesion between the base and the first fixing component and between the base and the second fixing component. Moreover, since the contact portion between the first fixing component and the second fixing component is threaded, a contact area can be increased as compared to the case where the contact portion is flat. With this, the thermal resistance between the first fixing component and the second fixing component can be reduced.

Furthermore, in a light source device according to an aspect of the present disclosure, the void may include a filler that contains a metallic element.

With this configuration, the thermal resistance between the base and the first fixing component and between the base and the second fixing component can be reduced. Thus, performance of thermal dissipation from the base to the second fixing component can be enhanced.

Moreover, in a light source device according to an aspect of the present disclosure, the second fixing component may include a base recess in the second pressing surface, and the base may be disposed in the base recess.

With this configuration, the position of the base with respect to the second fixing component can be easily determined. Moreover, when the pressure is applied to the base, the malleability of the base allows the diameter of the base to increase and thereby causes the base to contact a side surface of the base recess. As a result, a contact area between the base and the second fixing component can be increased.

This can enhance performance of thermal dissipation from the base to the second fixing component.

Furthermore, in a light source device according to an aspect of the present disclosure, one of the first main surface and the first fixing component may include a first projection, the other one of the first main surface and the first fixing component may include a first depression, and the first projection and the first depression may engage with each other.

With this configuration, a contact area between the base and the first fixing component can be increased. This can enhance performance of thermal dissipation from the base to the first fixing component. Moreover, with configuration, the pressure by the first pressing surface can provide an adequate contact area between the base and the first fixing component without any depression in the base. Thus, the pressure applied to the base by the first pressing surface can be reduced.

Moreover, in a light source device according to an aspect of the present disclosure, one of the second main surface and the second fixing component may include a second projection, the other one of the second main surface and the second fixing component may include a second depression, and the second projection and the second depression may engage with each other.

With this configuration, a contact area between the base and the second fixing component can be increased. This can enhance performance of thermal dissipation from the base to the second fixing component. Moreover, with configuration, the pressure by the second pressing surface can provide an adequate contact area between the base and the second fixing component without any depression in the base. Thus, the pressure applied to the base by the second pressing surface can be reduced.

Furthermore, in a light source device according to an aspect of the present disclosure, one of a proof stress and a yield point of a material used for forming the first fixing component may be higher than a corresponding one of a proof stress and a yield point of a material used for forming the base.

With this configuration, the malleability of the base allows a recessed surface to be easily formed around the outer region of the base in accordance with the shape of the first pressing surface. This can increase the contact area between the base and the first fixing component, and thus the thermal dissipation path to the first fixing component can be increased.

Moreover, in a light source device according to an aspect of the present disclosure, the base may have, around an outer region of the first main surface, a recessed surface that is recessed from a central region of the first main surface and that contacts the first fixing component.

With this configuration, the first main surface can contact the inner surface of the first through-hole of the first fixing component. This can enhance performance of thermal dissipation from the base to the first main surface. Moreover, suppose that a recessed surface is formed by the application of pressure to the first main surface by the first pressing surface. In this case, even when the flatness of the first main surface and the first pressing surface is low and even when the surface roughness of the first main surface and the first pressing surface is high, the adhesion between the base and the first fixing component can be increased and the thermal dissipation performance of the light source device can be enhanced.

Furthermore, in a light source device according to an aspect of the present disclosure, the first fixing component may include: an intermediate barrel that is nearly cylindrical and disposed on the first main surface of the base; and a third fixing component that is disposed outside the intermediate barrel and has the first outer surface.

With this configuration, the base of the semiconductor light-emitting device can be prevented from contacting the third fixing component. Thus, even when the third fixing component is threadably joined to the second fixing component, pressure is indirectly applied from the third fixing component to the base. On this account, when the pressure is applied using the third fixing component, displacement of the semiconductor light-emitting device can be reduced.

Moreover, in a light source device according to an aspect of the present disclosure, the first fixing component may include a lens which the emission light from the semiconductor light-emitting element enters.

With this configuration, the light emitted from the semiconductor light-emitting device can be collected.

Furthermore, a light source device according to an aspect of the present disclosure may further include a housing which is connected to the semiconductor light-emitting device via the second fixing component. The housing may include a wavelength conversion member.

With this configuration, a wavelength of at least a part of the light emitted from the semiconductor light-emitting device can be converted. Moreover, heat generated by the semiconductor light-emitting device can be dissipated to the housing via the second fixing component.

Moreover, in a light source device according to an aspect of the present disclosure, the semiconductor light-emitting device may include a plurality of semiconductor light-emitting devices. The first fixing component may include a plurality of first fixing components. Each of the plurality of semiconductor light-emitting devices may be connected to the second fixing component via a corresponding one of the plurality of first fixing components.

With this configuration, high-power light can be emitted from the light source device.

Furthermore, in a light source device according to an aspect of the present disclosure, the semiconductor light-emitting element may be a nitride semiconductor laser element.

With this configuration, even when a nitride semiconductor laser element that is relatively high in operating voltage is used, thermal dissipation performance can be adequately achieved. Thus, performance of the nitride semiconductor laser element can be prevented from decreasing.

The present disclosure can provide a light source device that can efficiently dissipate heat generated by a semiconductor light-emitting device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 is a view showing typical materials and characteristics of a base, a first fixing component, and a second fixing component according to Embodiment 1;

DETAILED DESCRIPTION OF THE EMBODIMENTS

Hereinafter, embodiments according to the present disclosure are described with reference to the accompanying drawings. It should be noted that each of the embodiments below describes only a preferred specific example according to the present disclosure. Therefore, the numerical values, structural elements, the arrangement and connection of the structural elements, processes (steps), the processing order of the steps, and so forth described in the following embodiments are merely examples, and are not intended to limit the present disclosure. Thus, among the structural elements in the following embodiments, structural elements that are not recited in any one of the independent claims indicating top concepts according to the present disclosure are described as arbitrary structural elements.

Embodiment 1

Hereinafter, a light source device according to Embodiment 1 is described, with reference to the drawings.

Figure 1A:
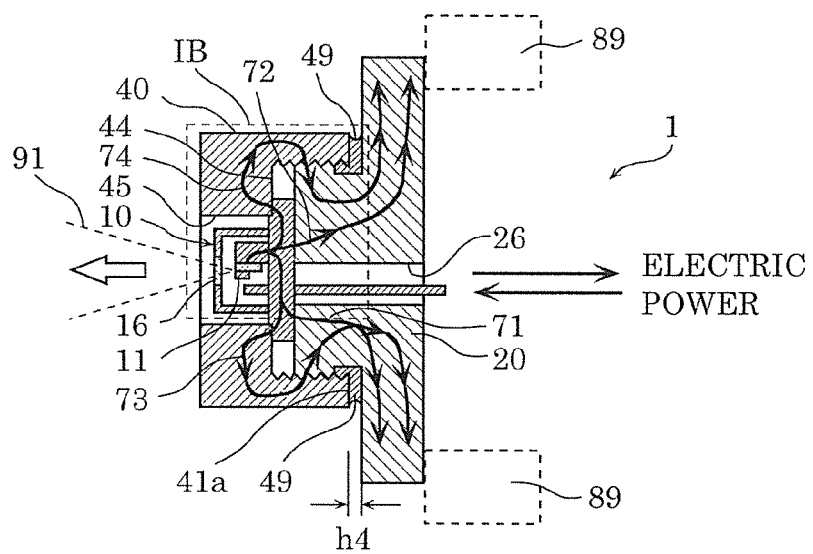
FIG. 1A is a schematic cross-sectional view showing a configuration of a light source device according to Embodiment 1.

FIG. 1A is a schematic cross-sectional view showing a configuration of light source device 1 according to the present embodiment.

Figure 1B:
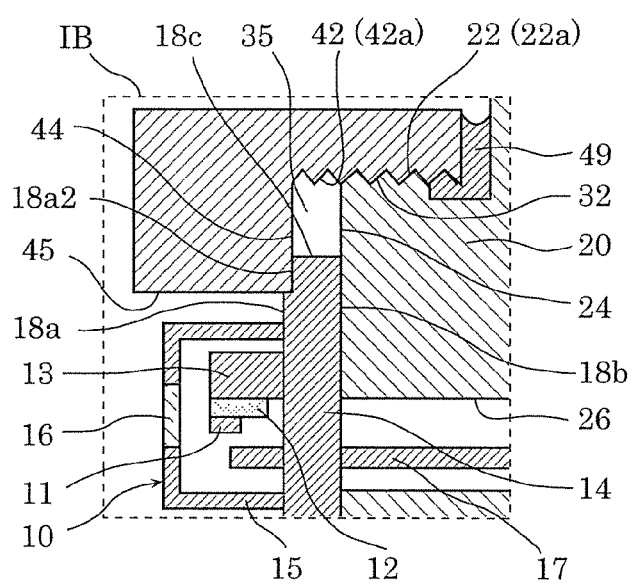
FIG. 1B is a schematic cross-sectional view showing a configuration of main components of the light source device according to Embodiment 1.

FIG. 1B is a schematic cross-sectional view showing a configuration of main components of light source device 1 according to the present embodiment. FIG. 1B is an enlarged cross-sectional view of components included in dashed-line box IB shown in FIG. 1A.

Figure 2:
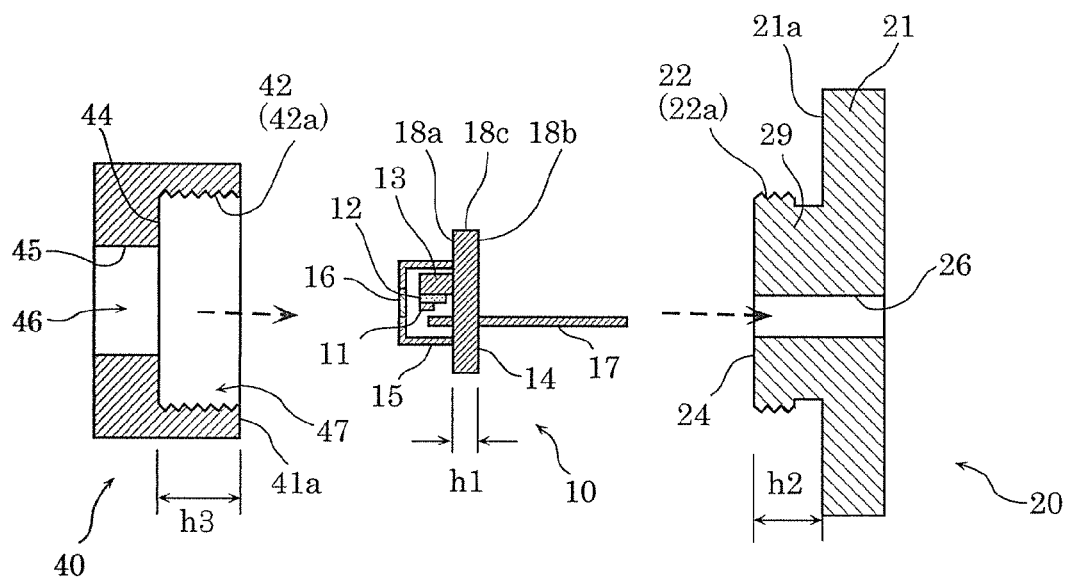
FIG. 2 is an exploded schematic cross-sectional view showing a configuration of the light source device according to Embodiment 1.

FIG. 2 is an exploded schematic cross-sectional view showing a configuration of light source device 1 according to the present embodiment.

As shown in FIG. 1A, FIG. 1B, and FIG. 2, light source device 1 according to the present embodiment includes semiconductor light-emitting device 10, first fixing component 40, and second fixing component 20.

As shown in FIG. 1B, semiconductor light-emitting device 10 includes the following: base 14 which is in the shape of a flat plate and includes first main surface 18a on a first side and second main surface 18b on a second side opposite to first main surface 18a; and semiconductor light-emitting element 11 which is disposed on the first side and thermally connected to base 14. Here, it should be noted that the "thermally connected" state refers to the state in which connection is achieved directly or via a highly thermally conductive member without heat insulation.

Semiconductor light-emitting element 11 of semiconductor light-emitting device 10 is implemented, via submount 12, on post 13 that is a protrusion formed on first main surface 18a of base 14. Base 14 is in the shape of, for example, a circular disk. Semiconductor light-emitting element 11 is a semiconductor laser element, for example. Base 14 includes the following: first main surface 18a that contacts first fixing component 40; second main surface 18b opposite to first main surface 18a; and side surface 18c. An opening is formed on a part of base 14 to include lead pin 17 used for supplying electric power to semiconductor light-emitting element 11. Moreover, cap 15 that includes transparent window 16 and covers semiconductor light-emitting element 11 is attached on the first side (on the side where semiconductor light-emitting element 11 is disposed).

First fixing component 40 has the following: first pressing surface 44 that presses first main surface 18a of base 14 toward second main surface 18b; and first through-hole 46 passing through first fixing component 40 in a direction that crosses first main surface 18a. Semiconductor light-emitting element 11 of semiconductor light-emitting device 10 is disposed inside first through-hole 46. Emission light 91 from semiconductor light-emitting element 11 is emitted from the inside of first through-hole 46 to the outside.

Second fixing component 20 has the following: second pressing surface 24 that presses second main surface 18b of base 14 toward first main surface 18a; and second through-hole 26 passing through second fixing component 20 in a direction that crosses second main surface 18b. In the present embodiment, second through-hole 26 of second fixing component 20 is used for connecting semiconductor light-emitting device 10 to an external power source (not illustrated). Moreover, second fixing component 20 has a larger thermal capacity than first fixing component 40. Second fixing component 20 is thermally connected to external thermal dissipation component 89. External thermal dissipation component 89 may be any member that dissipates heat transferred from second fixing component 20, and is not particularly limited to this member. When light source device 1 is used as automobile lighting, external dissipation component 89 may be an automobile body, for example. Alternatively, external thermal dissipation component 89 may be a cooling system that includes a Peltier element.

On the second side, first inner surface 42 surrounding first through-hole 46 of first fixing component 40 and second outer surface 22 of second fixing component 20 engage with each other. This allows base 14 to be fixed between first pressing surface 44 and second pressing surface 24. In the present embodiment, since base 14 is held between first fixing component 40 and second fixing component 20, base 14 and semiconductor light-emitting device 10 are fixed to first fixing component 40 and second fixing component 20. Moreover, first fixing component 40 and second fixing component 20 are in direct contact with each other between first inner surface 42 of first through-hole 46 of first fixing component 40 and second outer surface 22 of second fixing component 20, and are thereby thermally connected to each other. Here, second fixing component 20 has a larger thermal capacity than first fixing component 40. On this account, heat transferred to first fixing component 40 is transferred to second fixing component 20 via contact portion 32, which is shown in FIG. 1B, between first inner surface 42 and second outer surface 22.

In the present embodiment, contact portion 32 between first fixing component 40 and second fixing component 20 is in parallel with a direction that crosses first main surface 18a of base 14. To be more specific, contact portion 32 is not in parallel with first main surface 18a. Thus, contact portion 32 does not hinder a distance between first pressing surface 44 of first fixing component 40 and second pressing surface 24 of second fixing component 20 from becoming smaller than thickness h1 of base 14. At the same time, contact portion 32 where first fixing component 40 and second fixing component 20 contact each other can be provided. In this way, light source device 1 according to the present embodiment has a configuration in which base 14 can be applied with adequate pressure by first pressing surface 44 and second pressing surface 24. This configuration can reduce thermal resistance between base 14 and first fixing component 40 and between base 14 and second fixing component 20. Here, it should be noted that thickness h1 of base 14 refers to the thickness before base 14 is pressed by first pressing surface 44 and second pressing surface 24. Moreover, first pressing surface 44 refers to an entire surface on the inward side from first inner surface 42 surrounding first through-hole 46 of first fixing component 40, instead of referring only to a surface that is in direct contact with base 14. Similarly, second pressing surface 24 refers to an entire surface on the inward side from second outer surface 22 of second fixing component 20, instead of referring only to a surface that is in direct contact with base 14.

As described above, first fixing component 40 and second fixing component 20 have the configuration that does not hinder the distance between first pressing surface 44 and second pressing surface 24 from becoming smaller than thickness h1 of base 14. In other words, first fixing component 40 and second fixing component 20 have the configuration that allows first pressing surface 44 and second pressing surface 24 to press base 14 in a direction in which thickness h1 of base 14 becomes smaller. The distance between first pressing surface 44 and second pressing surface 24 is smaller than or equal to thickness h1 of base 14. Thus, a contact area between first pressing surface 44 and first main surface 18a of base 14 as well as a contact area between second pressing surface 24 and second main surface 18b of base 14 can be increased. With this, thermal resistance between base 14 and first fixing component 40 as well as thermal resistance between base 14 and second fixing component 20 can be reduced. This allows heat generated by semiconductor light-emitting device 10 to be efficiently dissipated to first fixing component 40 and second fixing component 20.

In the present embodiment, direct contact between second main surface 18b of base 14 and second pressing surface 24 of second fixing component 20 enables semiconductor light-emitting device 10 to be thermally connected to second fixing component 20. Moreover, direct contact between an outer region of first main surface 18a and first pressing surface 44 of first fixing component 40 enables semiconductor light-emitting device 10 to be thermally connected to first fixing component 40. Furthermore, an engagement between first inner surface 42 and second outer surface 22 enables first fixing component 40 to be thermally connected to second fixing component 20.

With this configuration, heat generated by semiconductor light-emitting element 11 is transferred to submount 12, post 13, and base 14 in this order in semiconductor light-emitting device 10. As shown in FIG. 1A, a part of the heat transferred to base 14 is dissipated to external thermal dissipation component 89 through thermal dissipation paths 71 and 72 from second main surface 18b of base 14 to second fixing component 20. Moreover, as shown in FIG. 1A, another part of the heat transferred to base 14 is dissipated to external thermal dissipation component 89 through thermal dissipation paths 73 and 74 from first main surface 18a to first fixing component 40 and then to second fixing component 20.

As described thus far, the heat generated by semiconductor light-emitting element 11 is transferred rapidly to second fixing component 20, which has a large thermal capacity, via the two thermal dissipation paths from base 14. This can suppress temperature increase of semiconductor light-emitting element 11.

Second fixing component 20 includes second through-hole 26 as described above. Lead pin 17 of semiconductor light-emitting device 10 is disposed in second through-hole 26, and is connected to a metal wire, which is not illustrated. Via this metal wire and lead pin 17, semiconductor light-emitting element 11 is supplied with electric power from the external power source (not illustrated). This externally-supplied power enables semiconductor light-emitting element 11 to emit light. Semiconductor light-emitting element 11 is disposed inside the first through-hole 46 of first fixing component 40 as described above. Thus, the light from semiconductor light-emitting element 11 passes through first through-hole 46 and is emitted to the outside. According to light source device 1 in the present embodiment as described thus far, the heat generated by semiconductor light-emitting element 11 can be dissipated without loss of electrical and optical performance of semiconductor light-emitting device 10.

Hereinafter, the configuration and function of light source device 1 are described more specifically. Note that the following description includes non-essential points.

In the present embodiment, base 14 and post 13 of semiconductor light-emitting device 10 are formed using a copper material. For example, an oxygen-free copper may be used. Semiconductor light-emitting element 11 is a nitride semiconductor laser element that is formed using, for example, a nitride semiconductor. Semiconductor light-emitting element 11 emits a laser beam having an emission wavelength in a range of 380 nm to 550 nm in the normal direction of first main surface 18a. Submount 12 is formed using, for example, a highly thermally conductive crystal, a polycrystal, or a ceramic material. To be more specific, materials, such as SiC, AlN, and diamond, may be used.

As described above, cap 15 that includes transparent window 16 and covers semiconductor light-emitting element 11 is attached on base 14. A material used for forming transparent window 16 may be any transparent material, and is not particularly limited to this material. For example, transparent window 16 is formed using a glass on which an antireflective coating is formed. A part of cap 15, other than a part corresponding to transparent window 16, is formed using a metal material, such as Kovar or an iron-nickel alloy.

First fixing component 40 is formed using a highly thermally conductive metal, such as iron. First fixing component 40 is provided with through-hole 46. First through-hole 46 has recess 47 and opening 45. Recess 47 is provided for first fixing component 40 on the side closer to second fixing component 20, and is nearly in the shape of a circular cylinder. Opening 45 passes through first fixing component 40 in a direction of light emission from first pressing surface 44 that is the bottom surface of recess 47 to semiconductor light-emitting device 10.

In the present embodiment, a diameter of first through-hole 46 is larger than a diameter of base 14 of semiconductor light-emitting device 10 on the side closer to second fixing component 20, that is, in recess 47. Moreover, the diameter of first through-hole 46 is smaller than the diameter of base 14 in opening 45. With this, semiconductor light-emitting device 10 can be inserted into first fixing component 40 from the side closer to second fixing component 20. First main surface 18a of base 14 can be pressed by first pressing surface 44 formed in a recessed surface where the diameter of first through-hole 46 changes. In the present embodiment, first pressing surface 44 is flat.

First inner surface 42 surrounding first through-hole 46 of first fixing component 40 includes first thread 42a formed as a female thread.

Here, depth h3 from end surface 41a of first fixing component on the side closer to second fixing component 20 to first pressing surface 44 as shown in FIG. 2 is determined on the basis of, for example, the thickness of base 14. First thread 42a is formed as a female thread on inner surface 42.

As with first fixing component 40, second fixing component 20 is formed using a highly thermally conductive metal, such as an aluminum alloy. As shown in FIG. 2, boss 29 is provided for second base stand 21 that is in the shape of a plate, on the side closer to first fixing component 40. Second outer surface 22 of second fixing component 20 includes second thread 22a formed as a male thread. Here, second thread 22a is formed to engage with first thread 42a of first fixing component 40. More specifically, first thread 42a and second thread 22a are formed to threadably join together. In other words, the male thread portion included in second fixing component 20 engages with the female thread portion included in first fixing component 40.

Second pressing surface 24 that presses second main surface 18b of base 14 of semiconductor light-emitting device 10 is formed on a top surface of boss 29 of second fixing component 20 (that is, on an end surface on the side closer to first fixing component 40). Note that second pressing surface 24 has height h2 measured from main surface 21a of second base stand 21. Second through-hole 26 that passes through second fixing component 20 is provided near a central region of second pressing surface 24. Lead pin 17 of semiconductor light-emitting device 10 is disposed inside second through-hole 26. Here, lead pin 17 is disposed not to contact second fixing component 20. Semiconductor light-emitting element 11 is supplied with electric power via lead pin 17 from the external power source.

As shown in FIG. 1A, FIG. 1B, and FIG. 2, first fixing component 40 and second fixing component 20 described above fix semiconductor light-emitting device 10 by holding base 14 of semiconductor light-emitting device 10 between first pressing surface 44 of first fixing component 40 and second pressing surface 24 of second fixing component 20. Here, thickness h1 of base 14 is set to satisfy h3<h2+h1. Such setting of thickness h1 does not cause first fixing component 40 and second fixing component 20 to hinder the distance between first pressing surface 44 and second pressing surface 24 from becoming smaller than thickness h1 of base 14. Moreover, void 35 is formed lateral to base 14 (that is, near side surface 18c), between first pressing surface 44 of first fixing component 40 and second pressing surface 24 of second fixing component 20. In the present embodiment, void 35 is an enclosed region surrounded by first fixing component 40, second fixing component 20, and base 14.

The configuration described above can achieve close contact between first pressing surface 44 and first main surface 18a of base 14 and between second pressing surface 24 and second main surface 18b of base 14. To be more specific, a contact area between first pressing surface 44 and first main surface 18a and a contact area between second pressing surface 24 and second main surface 18b can be increased. Then, heat generated by semiconductor light-emitting element 11 can be dissipated to second fixing component 20 via base 14. Furthermore, in the present embodiment, this heat can be transferred from base 14 to first fixing component 40 and then dissipated to second fixing component 20 via a contact surface (contact portion 32) between first thread 42a and second thread 22a.

As shown in FIG. 1A, end surface 41a of first fixing component 40 is separated from main surface 21a of second fixing component 20 by width h4 (=h1+h2−h3). Here, adhesive member 49 that is, for example, an epoxy adhesive resin can be inserted between end surface 41a and main surface 21a to prevent loosening between first fixing component 40 and second fixing component 20.

Moreover, in the above configuration, main surface 18a of base 14 is pressed by first fixing component 40 formed using a material that is firmer than base 14. With this, as shown in FIG. 1B, malleability of base 14 causes recessed surface 18a2 to be formed in the part where first main surface 18a is recessed. As a result, base 14 has, around the outer region of first main surface 18a, recessed surface 18a2 that is recessed from a central region of first main surface 18a and that contacts first fixing component 40.

With this method, even when the flatness of main surface 18a and first pressing surface 44 is low and even when the surface roughness of first main surface 18a and first pressing surface 44 is high, adhesion between base 14 and first fixing component 40 can be achieved. Thus, thermal dissipation performance of light source device 1 can be enhanced. Moreover, since the diameter of recess 47 of first fixing component 40 is larger than base 14, base 14 is allowed to increase in diameter. Thus, recessed surface 18a2 can be easily formed.

Next, materials used for forming base 14, first fixing component 40, and second fixing component 20 according to the present embodiment are described with reference to the drawing.

FIG. 3 is a view showing typical materials and characteristics of base 14, first fixing component 40, and second fixing component 20 according to the present embodiment.

A material used for forming base 14 may be highly thermally conductive and have a low yield point or proof stress (for example, 0.2% proof stress). As shown in FIG. 3, base 14 may be formed using copper (oxygen-free copper: C1020) or aluminum (pure aluminum: A1050), for example.

A material used for forming first fixing component 40 and second fixing component 20 may be higher in yield point or proof stress than the material of base 14. For example, an aluminum alloy (such as ADC12), a zinc alloy, iron steel, or stainless steel may be used.

Next, an advantageous effect of light source device 1 according to the present embodiment is described with reference to the drawings.

Figure 4:
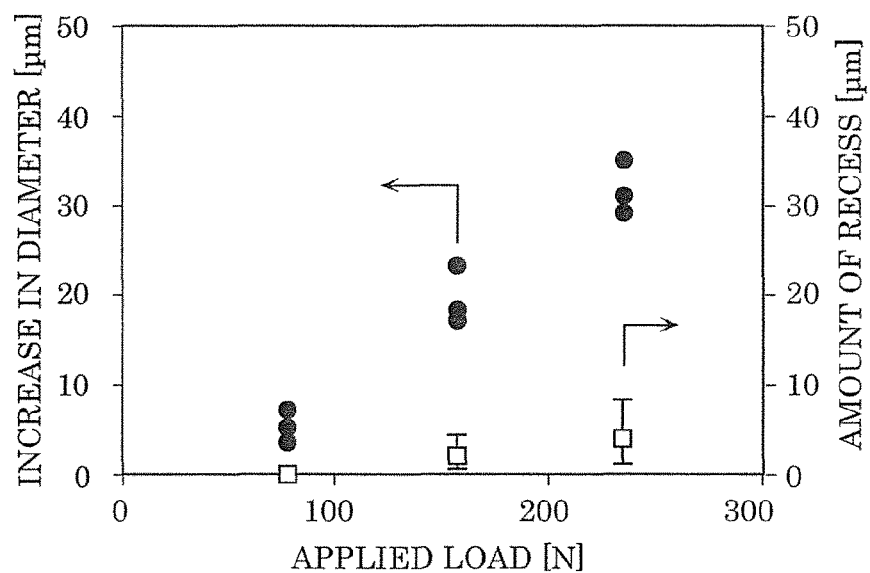
FIG. 4 is a graph showing a relationship among the amount of increase in the diameter of the base, the amount of recess of the base, and the load applied to the base according to Embodiment 1.

FIG. 4 is a graph showing a relationship among the amount of increase in the diameter of base 14, the amount of recess of base 14, and the load applied to the base, according to the present disclosure.

Figure 5:
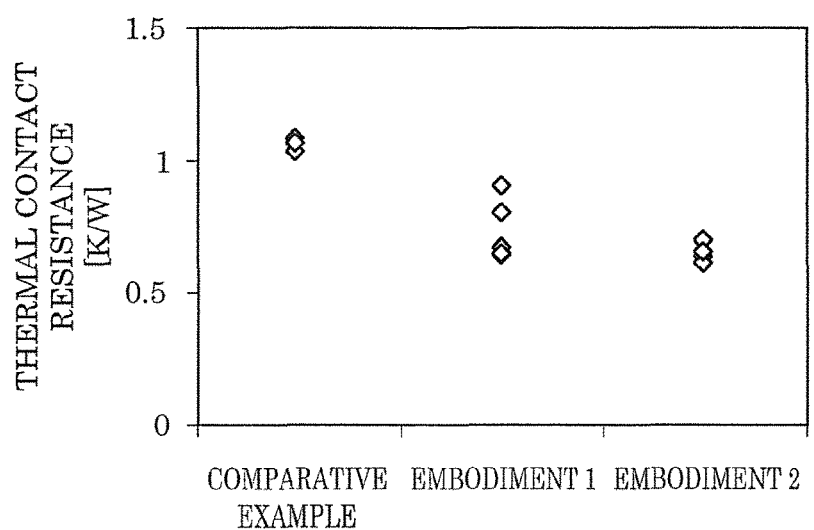
FIG. 5 is a graph showing thermal resistance between the base and the second fixing component according to Embodiment 1.

FIG. 5 is a graph showing thermal resistance between base 14 and second fixing component 20, according to the present embodiment. In FIG. 5, thermal resistance according to a comparative example is shown as well.

FIG. 4 is a graph showing the amount of change in the diameter of base 14 (filled circles) and the amount of recess of base 14 (open squares). In this example, base 14 of semiconductor light-emitting device 10 is a circular plate that is formed from oxygen-free copper and is 9 mm in diameter and 1.5 mm in thickness. Then, the outer region of base 14 is pressed by a metal cylinder formed from stainless steel and having a bore diameter of 8 mm. As shown in FIG. 4, the diameter of base 14 is increased by about 30 μm when the applied load is 240 N, causing a recess of about 2 μm to 9 μm. In the present embodiment, when base 14 is increased in diameter as described above, the diameter is not hindered from increasing because void 35 is formed lateral to base 14.

FIG. 5 is a graph showing thermal resistance from base 14 to second fixing component 20 when semiconductor light-emitting device 10 is held between second fixing component 20 and first fixing component 40. FIG. 5 also shows thermal resistance according to a comparative example in which semiconductor light-emitting device 10 is bonded to second fixing component 20 only by means of soldering instead of using first fixing component 40. It can be understood from the graph that, as compared to the case where the bonding is achieved only by means of soldering, the thermal resistance according to the present embodiment is significantly reduced. In this way, light source device 1 according to the present embodiment can efficiently dissipate the heat generated by semiconductor light-emitting element 11.

Variation 1 of Embodiment 1

Hereinafter, a light source device according to Variation 1 of Embodiment 1 is described. The light source device according to the present variation has a configuration with which thermal dissipation performance of light source device 1 according to Embodiment 1 is enhanced more. The following mainly describes differences between the light source device according to the present variation and light source device 1 according to Embodiment 1, with reference to the drawings.

Figure 6:
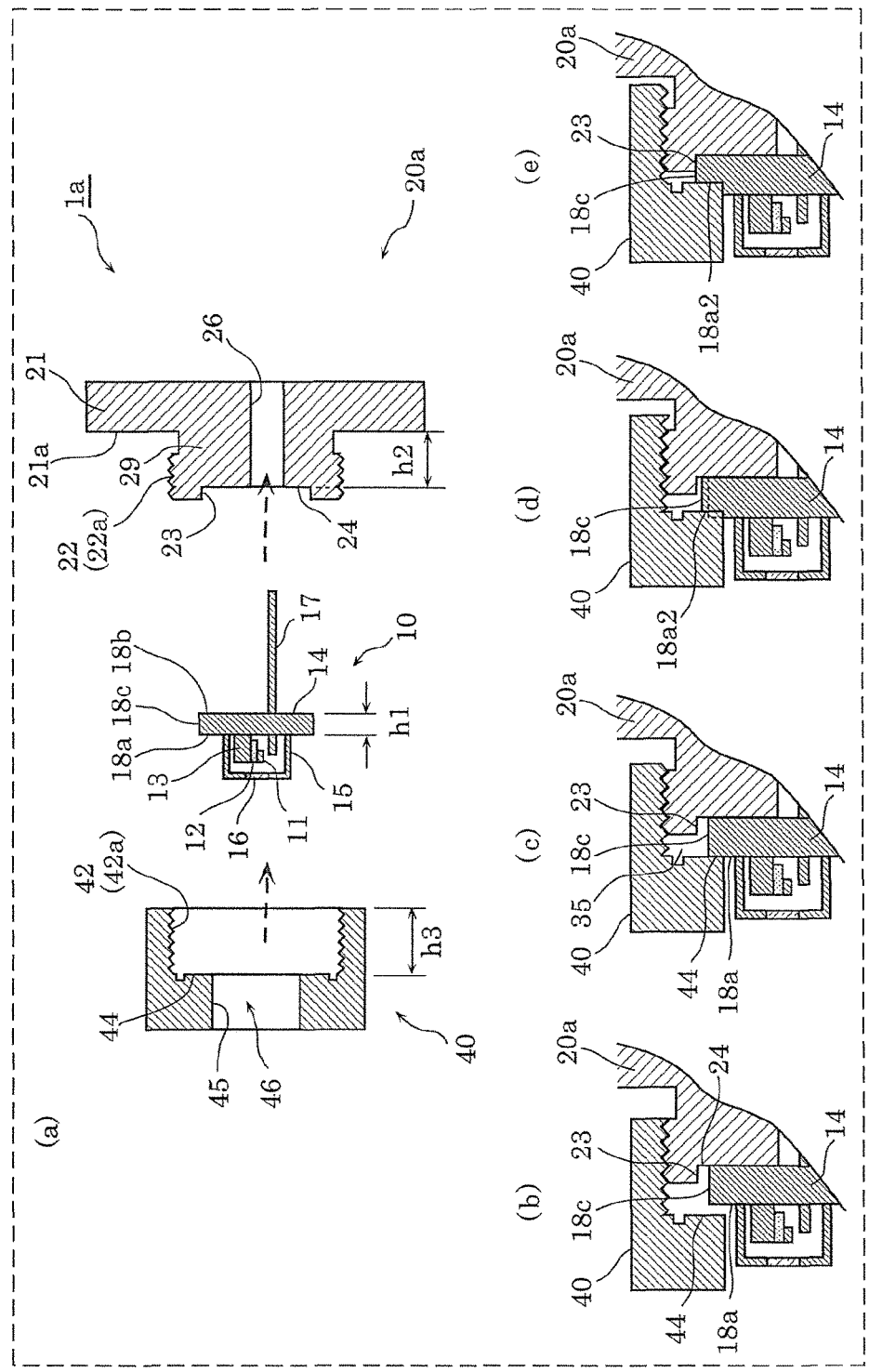
FIG. 6 is a schematic cross-sectional view showing a configuration and a manufacturing process of a light source device according to Variation 1 of Embodiment 1.

FIG. 6 is a schematic cross-sectional view showing a configuration and a manufacturing process of light source device 1a according to the present variation.

Figure 7:
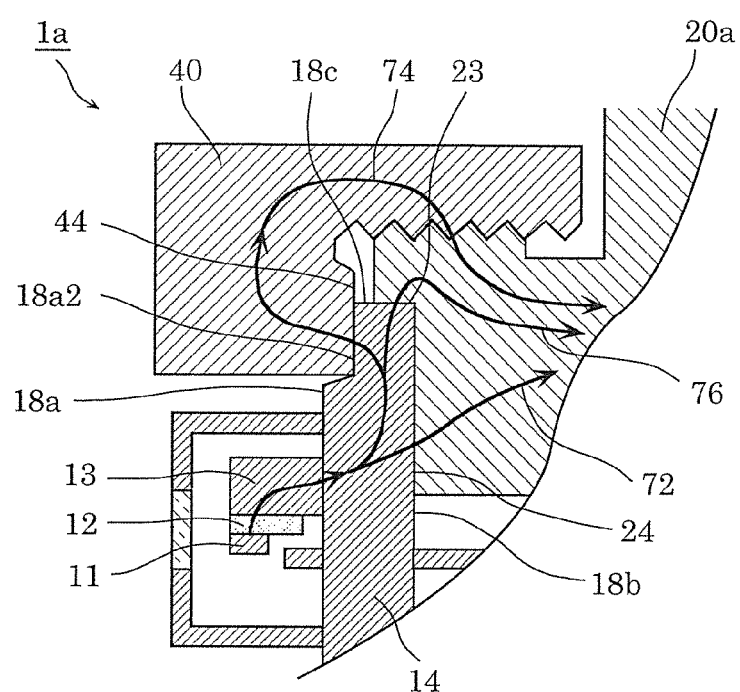
FIG. 7 is a schematic partial cross-sectional view showing a configuration of main components of the light source device according to Variation 1 of Embodiment 1.

FIG. 7 is a schematic partial cross-sectional view showing a configuration of main components of light source device 1a according to the present variation.

As shown in (a) of FIG. 6, light source device 1a according to the present variation is different from light source device 1 according to Embodiment 1 in that base recess 23 corresponding to the shape of base 14 of semiconductor light-emitting device 10 is provided on a top surface of boss 29 of second fixing component 20a. Base recess 23 is provided in a central region of second pressing surface 24 and has a flat bottom surface. Base 14 is disposed inside base recess 23. A diameter of base recess 23 is slightly larger than a diameter of base 14. For example, the diameter of base recess 23 is larger than the diameter of base 14 approximately by 5 µm or more but not exceeding 50 µm. With this configuration, the position of semiconductor light-emitting device 10 with respect to second fixing component 20 can be easily determined. Then, as shown in (b) and (c) of FIG. 6, first fixing component 40 is rotated with respect to second fixing component 20a to allow first inner surface 42 of first fixing component 40 to threadably join to second outer surface 22 of second fixing component 20a. This causes first main surface 18a of base 14 to contact first pressing surface 44. As a result, the thermal dissipation path, which is shown in FIG. 1A, from base 14 to first fixing component 40 can be formed.

Furthermore, as shown in (c) and (d) of FIG. 6, first fixing component 40 is caused to press against base 14. Here, the pressure is applied to base 14 until a plastic zone of the material used for forming base 14 appears. As a result, a part of base 14 is deformed to extend in a direction of void 35. To be more specific, malleability of base 14 allows a part included in main surface 18a of base 14 and pressed by first pressing surface 44 to be formed into recessed surface 18a2 as well as causing side surface 18c of base 14 to extend outward. In this way, recessed surface 18a2 can be easily formed in first main surface 18a of base 14. As a result of this, while the adhesion between base 14 and first fixing component 40 is enhanced, the thermal resistance in the thermal dissipation path from base 14 to first fixing component 40 can be reduced.

Moreover, as shown in (e) of FIG. 6 according to the present variation, base recess 23 is formed in a manner that the diameter of base recess 23 is appropriately larger than the diameter of base 14 to adjust the amount of pressure applied by first fixing component 40. With this, recessed surface 18a2 is formed in main surface 18a of base 14 and, at the same time, side surface 18c of base 14 contacts a side surface (which is nearly perpendicular to second pressing surface 24) of base recess 23. As a result, in addition to thermal dissipation paths 72 and 74, thermal dissipation path 76 for the heat to be dissipated from surface 18c of base 14 to second fixing component 20a are formed, as shown in FIG. 7. Here, thermal dissipation path 72 dissipates the heat from second main surface 18b of base 14 to second fixing component 20a, and thermal dissipation path 74 dissipates the heat from recessed surface 18a2 formed in first main surface 18a to first fixing component 40. Thus, since base 14 is pressed to come in contact with the side surface of base recess 23, a contact area between base 14 and second fixing component 20a can be increased. This can enhance performance of thermal dissipation from base 14 to second fixing component 20a.

Hereinafter, a method of manufacturing first fixing component 40 and second fixing component 20a of light source device 1a according to the present variation is described.

First fixing component 40 is formed using a metal material that is firmer than base 14, or more specifically, that has a high yield point or a high proof stress. For example, first fixing component 40 may be formed using stainless steel and molded by press molding. Note that recess 47 and opening 45 are also formed during press molding. Moreover, first thread 42a as a female thread is formed on first inner surface 42 by machine processing using a thread cutting die. Then, rust proofing is performed on the surface by plate processing using nickel or gold, for example.

Second fixing component 20a is formed from an aluminum alloy that is high in thermal conductivity, by combination of casting and machine processing using, for example, an end mill. To be more specific, second base stand 21 including boss 29 in the shape of a circular cylinder to form the male thread and base recess 23 in the shape of a circle is firstly molded by casting. After this, second thread 22a is formed as the male thread on a side surface of boss 29 by machine processing using a thread cutting die. Then, rust proofing is performed on the surface by plate processing using nickel or gold, for example. Moreover, to promote adhesion with second main surface 18b of base, it is preferable for an average surface roughness (Ra) of the bottom surface of base recess 23 to be 10 µm or less.

By the method described above, first fixing component 40 and second fixing component 20a can be manufactured easily. Then, contact portion 32 is formed by flank surfaces of first thread 42a and second thread 22a to increase the contact area between first fixing component 40 and second fixing component 20a. As a result, effective thermal dissipation paths can be formed. It should be noted that the manufacturing method according to the present variation is only a representative example and that the method is not limited to this example. For example, first fixing component 40 and second fixing component 20a may be fixed to each other by means of soldering or using a low-melting-point inorganic material such as low-melting-point glass. Alternatively, first fixing component 40 and second fixing component 20a may be fixed to each other by spot welding.

More specifically, a gap between first fixing component 40 and second fixing component 20a is irradiated with a high-power laser beam. This causes first fixing component 40 and second fixing component 20a to partially melt to form adhesive member 49. As a result of this, first fixing component 40 and second fixing component 20a can adhere to each other.

Variation 2 of Embodiment 1

Hereinafter, a light source device according to Variation 2 of Embodiment 1 is described. The light source device according to the present variation has a configuration in which a semiconductor light-emitting device and a second fixing component that are more desirable are formed. The following mainly describes differences between the light source device according to the present variation and light source device 1a according to Variation 1 of Embodiment 1, with reference to the drawings.

Figure 8A:
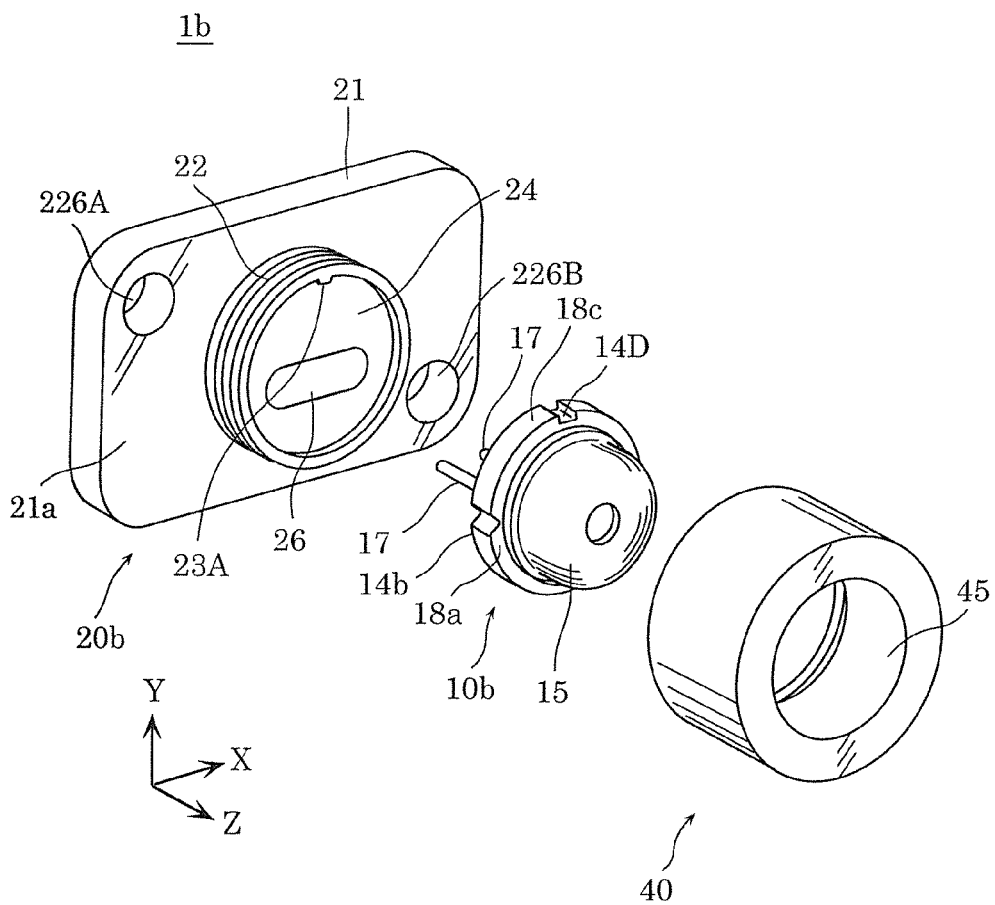
FIG. 8A is a schematic exploded perspective view showing a configuration of a light source device according to Variation 2 of Embodiment 1.

FIG. 8A is a schematic exploded perspective view showing a configuration of light source device 1b according to the present variation.

Figure 8B:
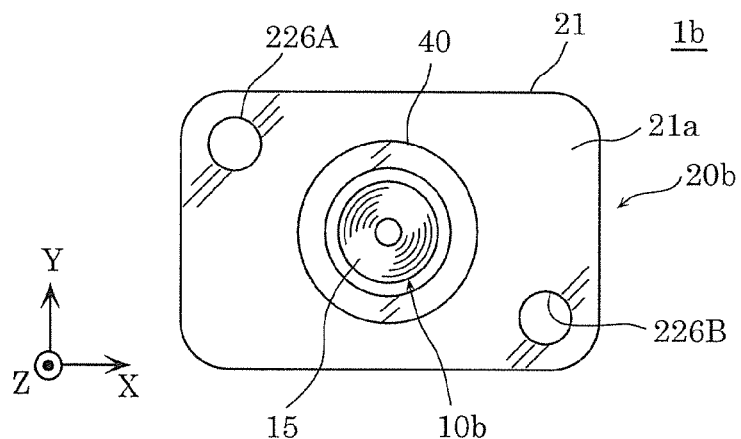
FIG. 8B is a schematic top view showing a configuration of the light source device according to Variation 2 of Embodiment 1.

FIG. 8B is a schematic top view showing a configuration of light source device 1b according to the present variation. FIG. 8B is a top view showing the configuration viewed from above first main surface 18a of base 14b of light source device 1b shown in FIG. 8A.

It should be noted that a light emission direction of light source device 1b is defined as a z-axis normal direction in FIG. 8A and FIG. 8B.

As shown in FIG. 8A, second base stand 21 of second fixing component 20b in light source device 1b according to the present variation includes through-holes 226A and 226B that are formed to fix second fixing component 20b externally. Moreover, base recess 23 includes protrusion 23A to prevent semiconductor light-emitting device 10b from rotating when first fixing component 40 is caused to threadably join to second fixing component 20b. Furthermore, side surface 18c of base 14b of semiconductor light-emitting device 10b includes notch 14D that corresponds to protrusion 23A.

With the configuration described above, when semiconductor light-emitting device 10b attached to second fixing component 20b is applied with pressure by rotation of first fixing component 40, semiconductor light-emitting device 10b can be prevented from rotating because of friction with first fixing component 40. Thus, since base 14b of semiconductor light-emitting device 10b can be easily pressed by second pressing surface 24 of second fixing component 20b, adhesion between base 14b and second fixing component 20b can be easily enhanced.

Moreover, as shown in FIG. 8B, in light source device 1b according to the present variation, a perimeter of first fixing component 40 is encompassed by a perimeter of second fixing component 20b in the plan view of first main surface 18a of base 14b. With this configuration, the thermal capacity of second fixing component 20b is larger than that of first fixing component 40. Thus, heat transferred to first fixing component 40 is transferred to second fixing component 20b to achieve efficient thermal dissipation. It should be noted that, although not illustrated, not only the light source device according to the present variation but also each of light source devices in the other embodiments and variations according to the present disclosure has the configuration in which the perimeter of the first fixing component is encompassed by the perimeter of the second fixing component in the plan view of the first main surface of the base.

Variation 3 of Embodiment 1

Hereinafter, a light source device according to Variation 3 of Embodiment 1 is described. The light source device according to the present variation is different from light source device 1 according to Embodiment 1 in configuration of a base, a first pressing surface, and a second pressing surface. The following mainly describes differences between the light source device according to the present variation and light source device 1 according to Embodiment 1, with reference to the drawing.

Figure 9:
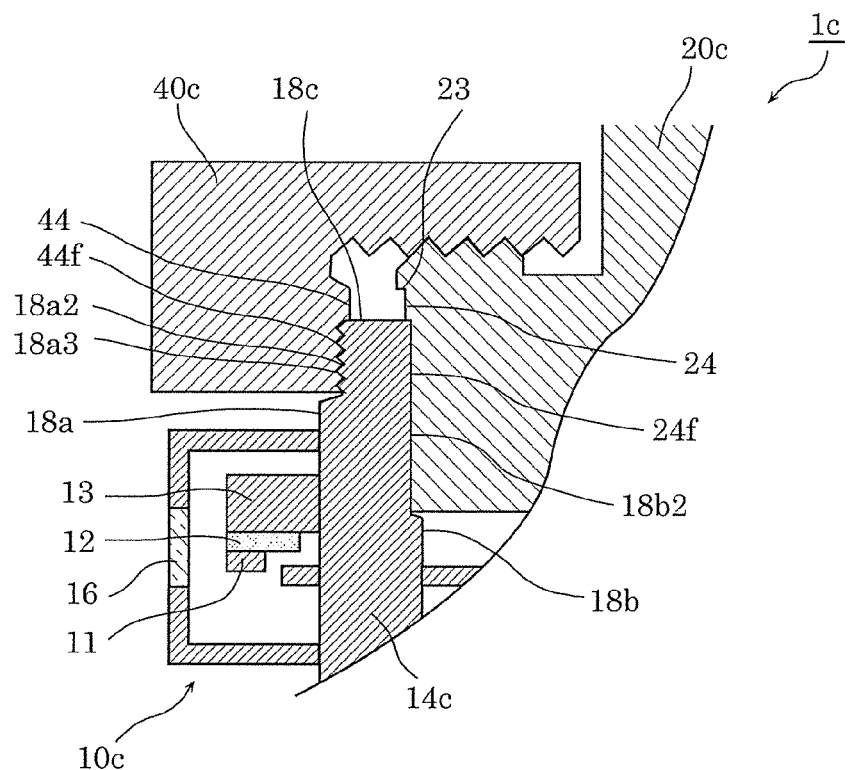
FIG. 9 is a schematic cross-sectional view showing a configuration of main components of a light source device according to Variation 3 of Embodiment 1.

FIG. 9 is a schematic cross-sectional view showing a configuration of main components of light source device 1c according to the present variation.

As shown in FIG. 9, recessed surface 18a2 and recessed surface 18b2 are formed, respectively, in first main surface 18a and second main surface 18b of base 14c of semiconductor light-emitting device 10c in light source device 1c according to the present variation. Moreover, circular groove 18a3 is formed in first main surface 18a. Depression 44f is formed in first pressing surface 44 of first fixing component 40c. Furthermore, recessed surface 24f is formed in second pressing surface 24 of second fixing component 20c.

Next, a method of manufacturing light source device 1c according to the present variation is described.

Firstly, first fixing component 40c is pressed against first main surface 18a of base 14c to apply an appropriate pressure via base 14c to second pressing surface 24 that is flat and included in second fixing component 20c. As a result of this, recessed surface 24f is formed in second pressing surface 24 of second fixing component 20c. Moreover, recessed surface 18b2 is formed in second main surface 18b of base 14c. Here, second main surface 18b is flat before the pressure application by first fixing component 40c. With this configuration, adhesion between second fixing component 20c and base 14c can be increased, and thermal dissipation performance of light source device 1c can be thus enhanced.

Moreover, when recessed surface 18a2 is formed in main surface 18a of base 14c, depression 44f is formed in first pressing surface 44 of first fixing component 40c. More desirably, when first fixing component 40c is applied with pressure while being rotated, circular groove 18a3 having a projection and a recess is formed in recessed surface 18a2.

With this configuration, adhesion between first fixing component 40c and base 14c can be increased, and thermal dissipation performance of light source device 1c can be thus enhanced.

Variation 4 of Embodiment 1

Hereinafter, a light source device according to Variation 4 of Embodiment 1 is described. The light source device according to the present variation is different from light source device 1 according to Embodiment 1 in configuration of a base, a first pressing surface, and a second pressing surface. The following mainly describes differences between the light source device according to the present variation and light source device 1 according to Embodiment 1, with reference to the drawing.

Figure 10:
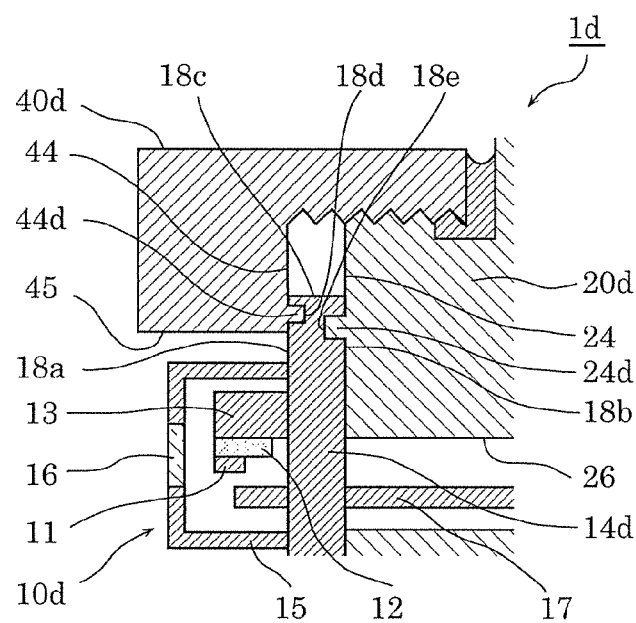
FIG. 10 is a schematic cross-sectional view showing a configuration of main components of a light source device according to Variation 4 of Embodiment 1.

FIG. 10 is a schematic cross-sectional view showing a configuration of main components of light source device 1d according to the present variation.

As shown in FIG. 10, light source device 1d according to the present variation is different from light source device 1 according to Embodiment 1 in that first projection 44d and second projection 24d are formed, respectively, in first pressing surface 44 of first fixing component 40d and second pressing surface 24 of second fixing component 20d. Moreover, light source device 1d according to the present variation is different from light source device 1 according to Embodiment 1 in that first depression 18*d* and second depression 18*e* are formed, respectively, in first main surface 18*a* and second main surface 18*b* of base 14*d* of semiconductor light-emitting device 10*d*. With this configuration of light source device 1*d* according to the present variation, a contact area between base 14*d* and first pressing surface 44 and a contact area between base 14*d* and second pressing surface 24 can be increased. This can enhance thermal dissipation performance of light source device 1*d*. Moreover, first projection 44*d*, second projection 24*d*, first depression 18*d*, and second depression 18*e* are previously formed in light source device 1*d* according to the present variation. In other words, a depressed surface or the like does not need to be formed in base 14*d* by pressure, according to the present variation. On this account, pressure applied by first pressing surface 44 and second pressing surface 24 of light source device 1*d* can be reduced according to the present variation.

In the present variation, the projections are formed in first pressing surface 44 and second pressing surface 24 and the recess is formed in base 14*d*. However, the configuration of the present variation is not limited to this. It is only required of the configuration to increase the contact area between base 14*d* and first pressing surface 44 and the contact area between base 14*d* and second pressing surface 24. For example, recesses may be formed in first pressing surface 44 and second pressing surface 24, and a projection may be formed in base 14*d*.

Embodiment 2

Hereinafter, a light source device according to Embodiment 2 is described. Light source device 101 according to the present embodiment is different from light source device 1*a* according to Variation 1 of Embodiment 1 in that a filler is used and that a lens module for collecting emission light is provided. The following mainly describes differences between light source device 101 according to the present embodiment and light source device 1*a* according to Variation 1 of Embodiment 1, with reference to the drawings.

Figure 11:
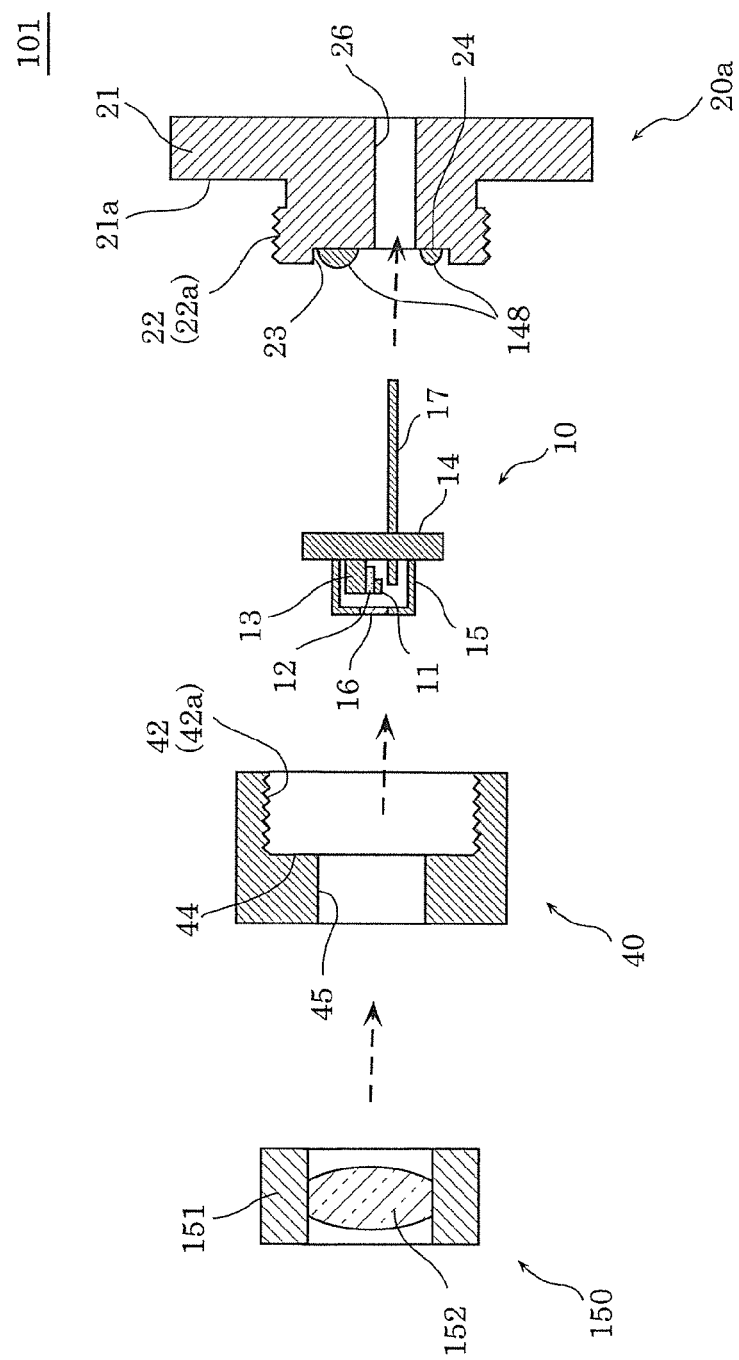
FIG. 11 is an exploded schematic cross-sectional view showing a configuration of a light source device according to Embodiment 2.

FIG. 11 is an exploded schematic cross-sectional view showing a configuration of light source device 101 according to the present embodiment.

Figure 12:
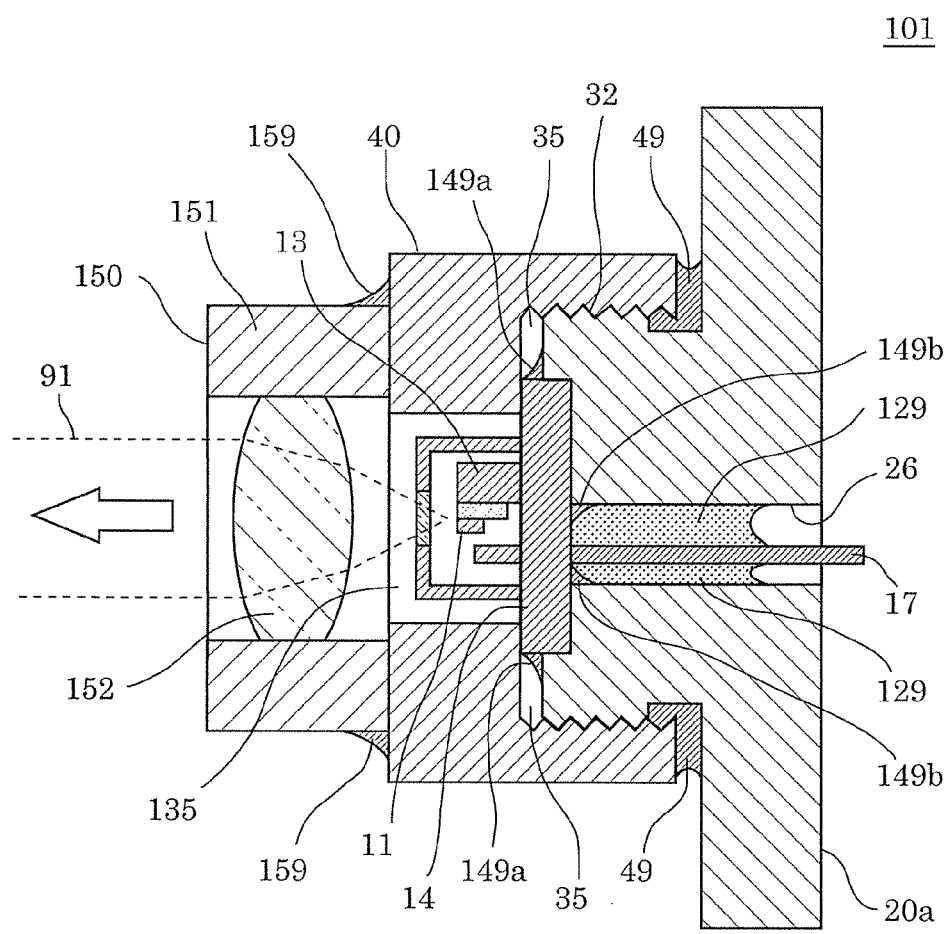
FIG. 12 is a schematic cross-sectional view showing a configuration of the light source device according to Embodiment 2.

FIG. 12 is a schematic cross-sectional view showing a configuration of light source device 101 according to the present embodiment.

As shown in FIG. 11, before semiconductor light-emitting device 10 is attached to second fixing component 20*a*, filler 148 is applied to a bottom surface of base recess 23 formed in second pressing surface 24 of second fixing component 20*a*, according to the present embodiment. Then, lens module 150 in which lens 152 is mounted on holder 151 is attached to an end surface of first fixing component 40 on the light emitting side. Here, lens 152 is integrally molded by, for example, metallic molding into holder 151 that is formed using a material such as iron. As shown in FIG. 12, adhesive portion 159 is formed by, for example, welding or soldering to firmly fix holder 151 to first fixing component 40.

In the above configuration, a material used for filler 148 contains a metallic element, for example. For instance, a material that is fluid at room temperature or at 200° C. or lower, such as heat dissipating grease or low-melting-point solder, is used. Examples of heat dissipating grease include silicon in which highly thermally conductive particles, such as alumina, are mixed. Examples of low-melting-point solder include tin and bismuth. After filler 148 described above is applied, semiconductor light-emitting device 10 is disposed into base recess 23 of second fixing component 20*a*. Then, first fixing component 40 is attached to second fixing component 20*a* in a manner to cover base 14. Thus, first fixing component 40 is threadably joined to second fixing component 20*a*. In this way, first fixing component 40 presses against base 14. In other words, the engagement between the female thread portion of first fixing component 40 and the male thread portion of second fixing component 20*a* presses base 14. Here, with an appropriate amount of application of filler 148, overflows 149*a* and 149*b*, which are slight amounts of overflows of filler 148, can be formed respectively in void 35 between first fixing component 40 and second fixing component 20*a* and in second through-hole 26 of second fixing component 20*a*. To be more specific, filler 148 is present in second through-hole 26 and void 35. With the configuration described thus far, even when minute clearance is formed between second fixing component 20*a* and base 14, filler 148 can fill this clearance. This can enhance performance of thermal dissipation from semiconductor light-emitting device 10 to second fixing component 20*a*. FIG. 5 is a diagram showing results of thermal resistance measured using the configuration according to the present embodiment. It can be seen that thermal resistance is reduced, and that unevenness of thermal resistance is also reduced.

Moreover, the size of void 35 and the amount of filler 148 are adjusted to cause overflow 149*a* to stay inside void 35, according to the present embodiment. For example, the amount of filler 148 may be adjusted in a manner that overflow 149*a* does not contact first pressing surface 44. With this configuration, filler 148 does not leak to base 14 on the side closer to semiconductor light-emitting element 11. On this account, even when filler 148 contains a volatile material, characteristics of light source device 101 can be prevented from deterioration caused by impurity precipitation in an optical path of emission light 91 during an operation of light source device 101.

Light source device 101 according to the present embodiment further includes lens module 150 to form space 135 near a light emitting portion of semiconductor light-emitting device 10. With this configuration, space 135 including a region that is near the light emitting portion of semiconductor light-emitting device 10 and that has a high optical density is isolated from filler 148 and outside air. This means that semiconductor light-emitting device 10 can be prevented from optical tweezers effect that may cause impurity precipitation in the high-optical-density region near the light emitting portion. Therefore, light source device 101 can also be prevented from deterioration in characteristics caused by the aforementioned precipitation.

Moreover, second through-hole 26 of second fixing component 20*a* is filled with filler 129 that has low permeability to gas, such as epoxy resin, according to the present embodiment. With this configuration, semiconductor light-emitting device 10 is isolated from outside air. Thus, even when base 14 is formed using a metal, such as iron or copper, semiconductor light-emitting device 10 can be prevented from performance deterioration caused by oxidation degradation.

Furthermore, void 35 may be filled with, in addition to overflow 149*a* of filler 148, a highly thermally conductive filler such as grease containing a metallic element. With this, thermal resistance between first fixing component 40 and second fixing component 20*a* can be further reduced.

Embodiment 3

Hereinafter, a light source device according to Embodiment 3 is described. The light source device according to the present embodiment has a configuration in which a wavelength conversion member including a phosphor or the like is added to light source device 101 according to Embodiment 2. The following describes a configuration and an operation of the light source device according to the present embodiment.

[Configuration]

Firstly, a configuration of the light source device according to the present embodiment is described, with reference to the drawings.

Figure 13:
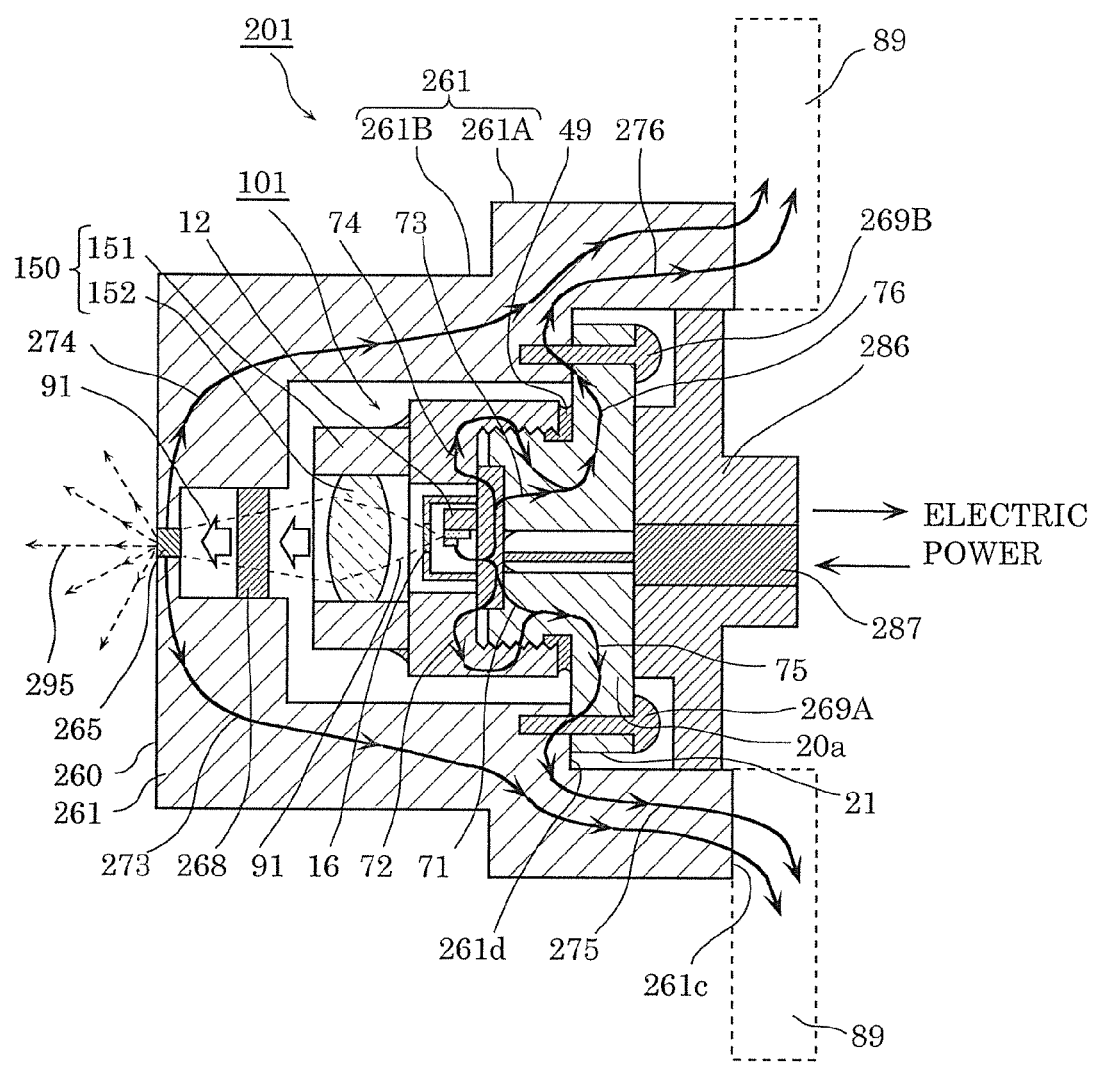
FIG. 13 is a schematic cross-sectional view showing a configuration of a light source device according to Embodiment 3.

FIG. 13 is a schematic cross-sectional view showing a configuration of light source device 201 according to the present embodiment.

Figure 14:
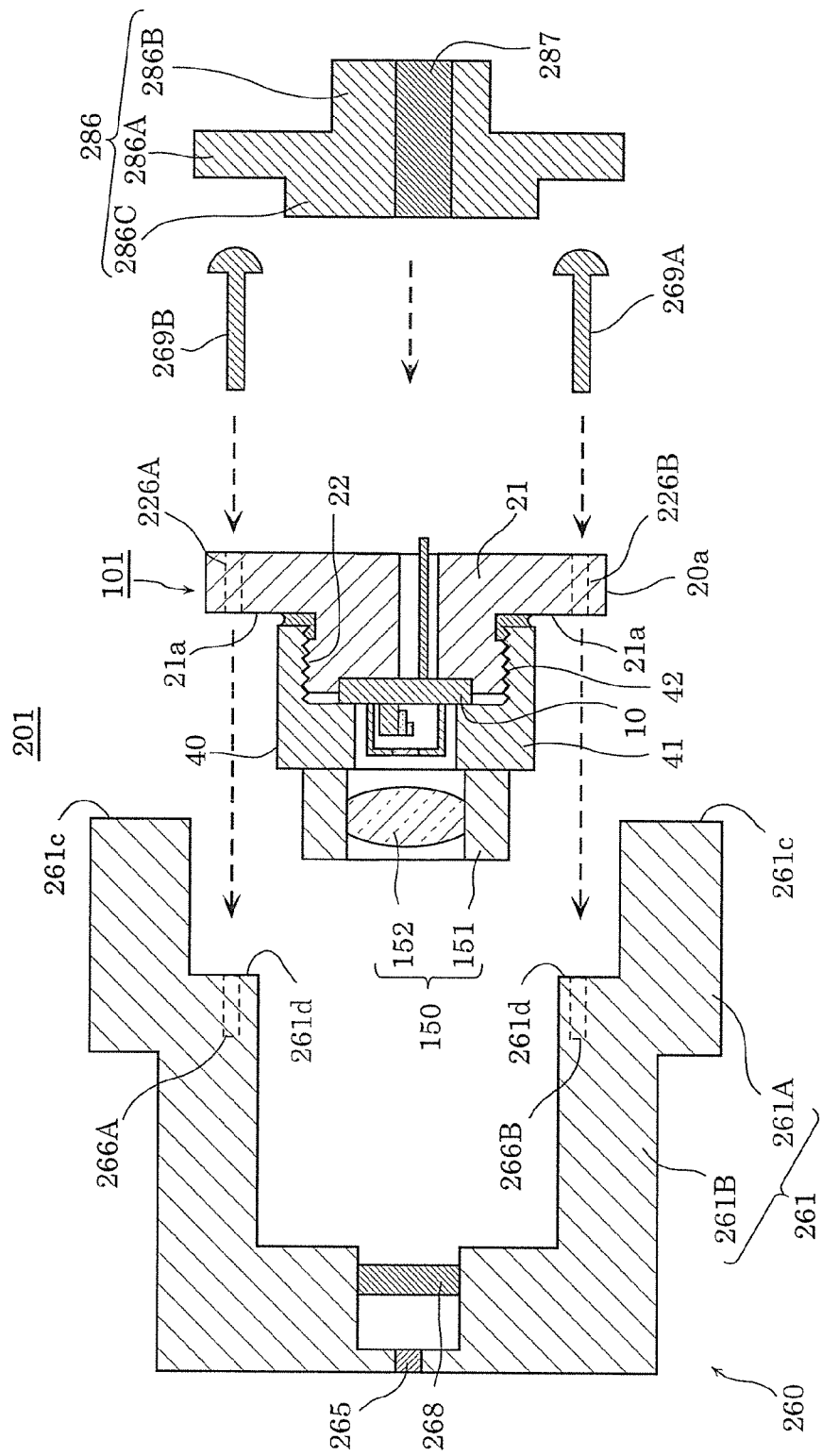
FIG. 14 is an exploded schematic cross-sectional view showing a configuration of the light source device according to Embodiment 3.

FIG. 14 is an exploded schematic cross-sectional view showing a configuration of light source device 201 according to the present embodiment.

Figure 15:
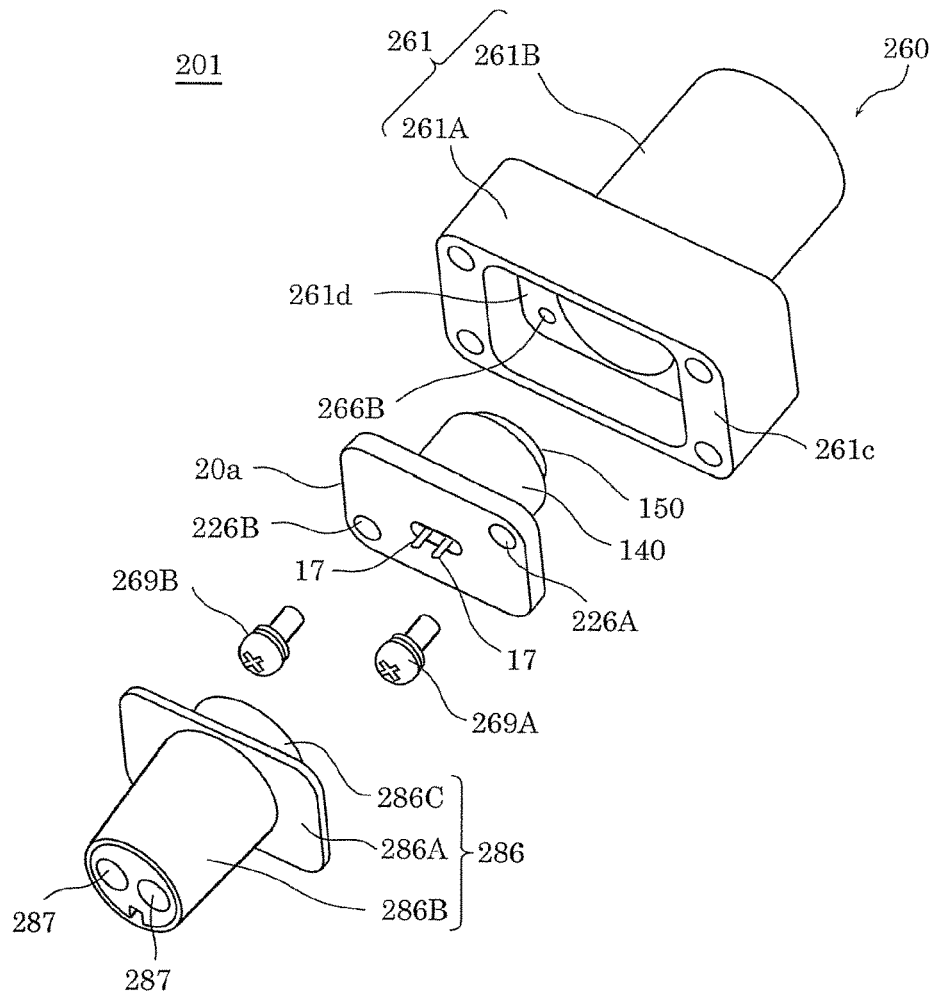
FIG. 15 is a schematic exploded perspective view showing a configuration of the light source device according to Embodiment 3.

FIG. 15 is a schematic exploded perspective view showing a configuration of light source device 201 according to the present embodiment.

As shown in FIG. 13 to FIG. 15, light source device 201 according to the present embodiment includes housing 260 and light source device 101 according to Embodiment 2 that is fixed to housing 260.

Second fixing component 20a of light source device 201 according to the present embodiment is fixed to housing 260 by means of threads 269A and 269B, as shown in FIG. 13. Light source device 201 further includes connector 286 that supplies semiconductor light-emitting device 10 with electric power from an outside source.

Housing 260 is a member that is connected to semiconductor light-emitting device 10 via second fixing component 20a. In the present embodiment, housing 260 includes third base stand 261, wavelength conversion member 265, and optical member 268 as shown in FIG. 14. With this configuration, light source device 201 according to the present embodiment can convert at least a part of a wavelength of light emitted from semiconductor light-emitting device 10.

Third base stand 261 of housing 260 is formed using a highly thermally conductive metal, such as an aluminum alloy. Moreover, wavelength conversion member 265 and optical member 268 are firmly fixed to third base stand 261. Third base stand 261 includes mount 261A and barrel 261B that may be formed using the same material and integrally molded, for example. As shown in FIG. 14, first flat surface 261c is formed to contact external thermal dissipation component 89, on an end surface of the opposite side of barrel 261B (an end surface on the right-hand side as viewed in FIG. 13). A recess is formed in mount 261A on the side closer to first flat surface 261c. This recess has second flat surface 261d that is formed to firmly fix second fixing component 20a. Moreover, second flat surface 261d includes screw holes 266A and 266B that are formed to fix second fixing component 20a by means of threads 269A and 269B.

As shown in FIG. 14, second fixing component 20a of light source device 201 includes through-holes 226A and 226B for allowing threads 269A and 269B to pass through. Here, opening diameters of through-holes 226A and 226B are sufficiently larger than diameters of thread parts of threads 269A and 269B. With this, the position of second fixing component 20a firmly fixed to semiconductor light-emitting device 10 as shown in FIG. 13 can be adjusted in a direction perpendicular to an optical axis. Thus, emission light 91 that is emitted from semiconductor light-emitting device 10 and collected by lens 152 can enter wavelength conversion member 265 accurately.

Wavelength conversion member 265 converts at least a part of light emitted from semiconductor light-emitting device 10 into light with a longer wavelength than the present light emitted from semiconductor light-emitting device 10. In the present embodiment, semiconductor light-emitting device 10 emits light, such as a laser beam, that has a wavelength in a range of 380 nm to 499 nm, for example. Wavelength conversion member 265 includes a phosphor that absorbs the light emitted from semiconductor light-emitting device 10 and converts the light into fluorescence with a longer wavelength. A material used for forming the phosphor is selected depending on a wavelength of the light emitted from semiconductor light-emitting device 10 and on a desired chromaticity coordinates of light emitted from light source device 201.

For example, suppose that the wavelength of the light emitted from semiconductor light-emitting device 10 is in a range of 420 nm to 499 nm and that light source device 201 emits white light. In this case, wavelength conversion member 265 includes a yellow phosphor that has a main fluorescence wavelength in a range of 540 nm to 610 nm and that has an upper fluorescence wavelength limit as about 660 nm.

For example, suppose that the wavelength of the light emitted from semiconductor light-emitting device 10 is in a range of 380 nm to 430 nm and that light source device 201 emits white light. In this case, wavelength conversion member 265 includes a green, yellow, or red phosphor that has a main fluorescence wavelength in a range of 500 nm to 660 nm and a blue phosphor that has a main fluorescence wavelength in a range of 430 nm to 500 nm.

For example, suppose that light source device 201 emits one-colored light, such as blue, green, yellow, or red light. In this case, wavelength conversion member 265 may include a phosphor that corresponds to chromaticity coordinates of a corresponding color.

Moreover, wavelength conversion member 265 may include a component that scatters light emitted from semiconductor light-emitting device 10 or fluorescence emitted from wavelength conversion member 265. For example, wavelength conversion member 265 may be internally provided with a scattering element, such as a light scattering particle.

Optical member 268 is a transparent member interposed between semiconductor light-emitting device 10 and wavelength conversion member 265. Optical member 268 can be provided for the light source device as necessary and is not essential. In the present embodiment, optical member 268 is a beam shaper that changes a cross-sectional shape of the light emitted from semiconductor light-emitting device 10 into a desired shape.

As shown in FIG. 14 and FIG. 15, connector 286 includes the following: flange 286A; external connection portion 286B that includes terminal 287 connected to an external terminal; and element connection portion 286C that is connected to semiconductor light-emitting device 10. After lead pin 17 of semiconductor light-emitting device 10 is inserted into element connection portion 286C of connector 286 to produce an electrical connection, flange 286A is fused with an inner wall of housing 260. Flange 286A is attached firmly to an inner wall of third base stand 261. For example, flange 286A is formed using plastic that exhibits low or zero moisture permeability, and is fused with the inner wall of third base stand 261. Third base stand 261 and wavelength conversion member 265 embedded in third base stand 261 are also formed using a material that exhibits low or zero moisture permeability. With this configuration, even when first fixing component 40 and second fixing component 20a are formed using a material that has high thermal dissipation performance and that easily rusts, such as copper, formation of rust after manufacturing of light source device 201 can be reduced.

Note that, in the present embodiment, wavelength conversion member 265 is formed through dispersion of a phosphor material in a transparent substrate or through formation of a phosphor material as a phosphor layer on a transparent substrate. Examples of the transparent substrate include silicon, low-melting-point glass, transparent ceramic, and sapphire. Moreover, the phosphor layer can be formed by laminating phosphor materials described later using silicon, low-melting-point glass, or the like as a binder. Furthermore, the phosphor layer may be a transparent substrate formed through sintering of the phosphor materials described later. When wavelength conversion member 265 formed in this way is included, chromaticity coordinates of emission light 295 emitted from light source device 201 can be adjusted as follows. For example, the adjustment can be made by adjusting the following: a material of the phosphor of wavelength conversion member 265; a density of dispersed phosphor or a density of phosphor in the phosphor layer; and a position where the phosphor layer is formed.

Moreover, examples of the yellow phosphor in the present embodiment include Ce-activated YAG phosphor ($(Y, Gd)_3 (Al, Ga)_5O_{12}$: Ce), Eu-activated α-SiAlON phosphor, and Eu-activated (Ba, Sr) $Si_2O_2N_2$ phosphor.

Furthermore, examples of the red phosphor in the present embodiment include Eu-activated (Sr, Ca) $AlSiN_3$ phosphor and Eu-activated $CaAlSiN_3$ phosphor.

Moreover, examples of the green phosphor in the present embodiment include Ce-activated $Lu_3Al_5O_{12}$ phosphor, Eu-activated ß-SiAlON phosphor, Eu-activated $SrSi_2O_2N_2$ phosphor, and Eu-activated (Ba, Sr) $Si_2O_2N_2$ phosphor.

Furthermore, examples of the blue phosphor in the present embodiment include Eu-activated $BaMgAl_{10}O_{17}$ phosphor, Eu-activated $Sr_3MgSi_2O_8$ phosphor, and Eu-activated $Sr_5(PO_4)_3Cl$ (SCA phosphor).

[Operation]

Next, an operation of light source device 201 is described.

Firstly, electric power is externally supplied to semiconductor light-emitting device 10 via connector 286 of light source device 201. With this, emission light 91 is generated in semiconductor light-emitting element 11 of semiconductor light-emitting device 10 as shown in FIG. 13. Emission light 91 is collected by lens 152, shaped by optical member 268, and enters wavelength conversion member 265. A part of emission light 91 entering wavelength conversion member 265 is converted into fluorescence that is different in wavelength from emission light 91, by a phosphor included in wavelength conversion member 265. After this, this light is emitted from light source device 201 as emission light 295 in which emission light 91 and the fluorescence are mixed. Here, a part of energy of emission light 91 absorbed by wavelength conversion member 265 is converted into heat. Then, the heat generated by wavelength conversion member 265 is transferred to barrel 261B and mount 261A of third base stand 261 and effectively dissipated to thermal dissipation component 89, through thermal dissipation paths 273 and 274 as shown in FIG. 13.

On the other hand, heat generated by semiconductor light-emitting element 11 for producing emission light 91 is transferred to second fixing component 20a via first fixing component 40 through thermal dissipation paths 72 and 74, and directly to second fixing component 20a through thermal dissipation paths 71 and 73, as in the case of light source device 1a according to Variation 1 of Embodiment 1. The heat transferred to second fixing component 20a is transferred to housing 260 via second flat surface 261d on which second fixing component 20a and housing 260 contact each other. Then, the heat is dissipated from housing 260 to external thermal dissipation component 89 via first flat surface 261c.

With this configuration, second fixing component 20a and housing 260 contact each other on the flat surface and are applied with pressure by the screws. Thus, the heat transferred from semiconductor light-emitting device 10 to second fixing component 20a can be effectively dissipated to housing 260. Moreover, housing 260 and external thermal dissipation component 89 may be fixed together using screws which are not illustrated. With this, the heat generated by light source device 201 can be effectively dissipated to external thermal dissipation component 89. Furthermore, light source device 201 according to the present disclosure is fixed at a predetermined position of housing 260 by means of threads 269A and 269B after positioning. Thus, wavelength conversion member 265 can be accurately irradiated with emission light 91 from semiconductor light-emitting device 10. Suppose that the size of wavelength conversion member 265 is extremely small, such as the case where wavelength conversion member 265 has a diameter of about 600 µm Φ and a thickness of about 50 µm. Even in such a case, wavelength conversion member 265 can be accurately irradiated with emission light 91 from semiconductor light-emitting device 10, and wavelength conversion can be efficiently performed by the phosphor.

Moreover, the optical path of emission light 91 emitted from semiconductor light-emitting device 10 is enclosed with first fixing component 40 and housing 260. This configuration allows the optical path to be cut off from outside air. This means that the surface of, for example, lens 152 can be prevented from unwanted adherents caused by optical tweezers effect and chemical reaction of high-density light with a wavelength of 499 nm or less. Therefore, the optical output of emission light 295 from light source device 201 can also be prevented from decreasing due to the aforementioned adherents.

Embodiment 4

Hereinafter, a light source device according to Embodiment 4 is described with reference to the drawings. The present embodiment is different from the embodiments described above in that a second inner surface surrounding a second through-hole of a second fixing component and a first outer surface of a first fixing component engage with each other on the first side. The following mainly describes differences between the light source device according to the present embodiment and the light source devices according to the embodiments described above, with reference to the drawings.

Figure 16:
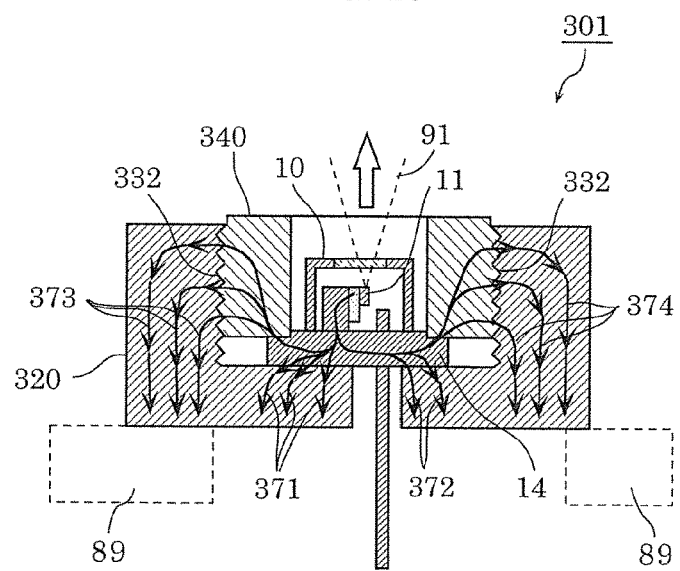
FIG. 16 is a schematic cross-sectional view showing a configuration of a light source device according to Embodiment 4.

FIG. 16 is a schematic cross-sectional view showing a configuration of light source device 301 according to the present embodiment.

Figure 17:
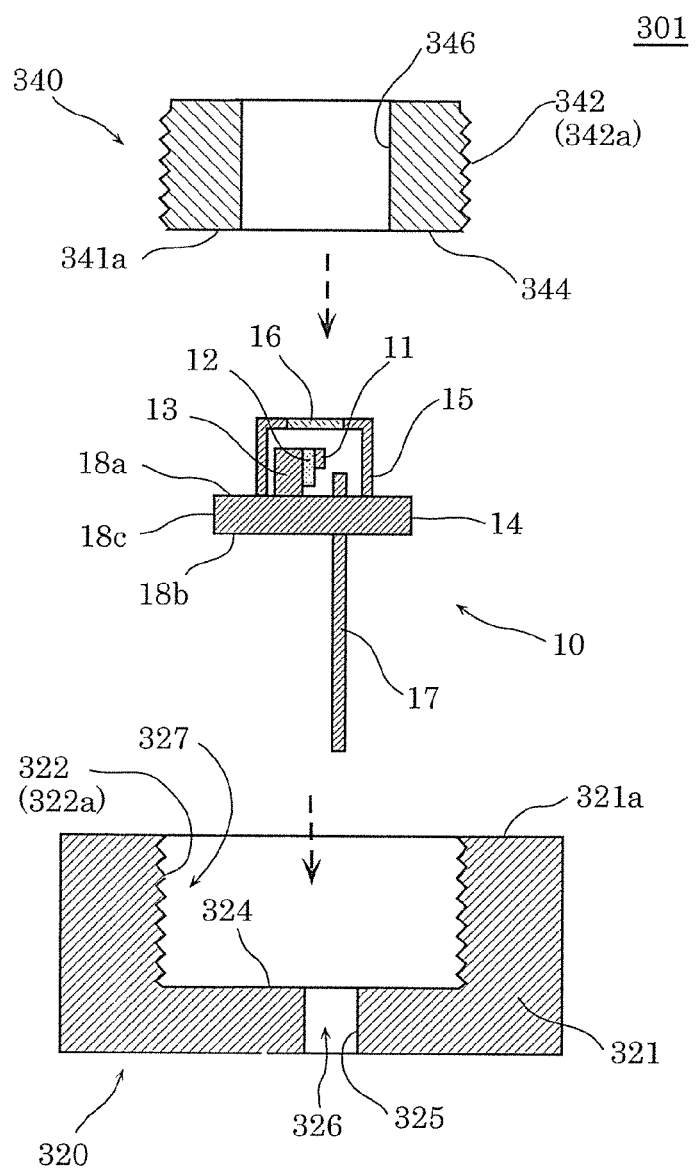
FIG. 17 is an exploded schematic cross-sectional view showing a configuration of the light source device according to Embodiment 4.

FIG. 17 is an exploded schematic cross-sectional view showing a configuration of light source device 301 according to the present embodiment.

As shown in FIG. 16 and FIG. 17, light source device 301 according to the present embodiment includes semiconductor light-emitting device 10, first fixing component 340, and second fixing component 320.

First fixing component 340 has the following: first pressing surface 344 that presses first main surface 18a of base 14 toward second main surface 18b; and first through-hole 346 passing through first fixing component 340 in a direction that crosses first main surface 18a. Semiconductor light-emitting element 11 of semiconductor light-emitting device 10 is disposed inside first through-hole 346. Emission light 91 from semiconductor light-emitting element 11 is emitted from the inside of first through-hole 346 to the outside.

Second fixing component 320 has the following: second pressing surface 324 that presses second main surface 18b of base 14 toward first main surface 18a; and second through-hole 326 passing through second fixing component 320 in a direction that crosses second main surface 18b. Also in the present embodiment, second fixing component 320 has a larger thermal capacity than first fixing component 340 and is thermally connected to an external thermal dissipation component (not illustrated).

On the second side, second inner surface 322 surrounding second through-hole 326 of second fixing component 320 and first outer surface 342 of first fixing component 340 engage with each other. This allows base 14 to be fixed between first pressing surface 344 and second pressing surface 324. In the present embodiment, since base 14 is held between first fixing component 340 and second fixing component 320, base 14 is fixed to first fixing component 340 and second fixing component 320. Moreover, first fixing component 340 and second fixing component 320 are in direct contact with each other between first outer surface 342 of first through-hole 346 of first fixing component 340 and second inner surface 322 of second through-hole 326 of second fixing component 320, and are thereby thermally connected to each other. Here, second fixing component 320 has a larger thermal capacity than first fixing component 340. On this account, heat transferred to first fixing component 340 is transferred to second fixing component 320 via contact portion 332 between first outer surface 342 and second inner surface 322.

Also in the present embodiment, first fixing component 340 and second fixing component 320 have the configuration that does not hinder the distance between first pressing surface 344 and second pressing surface 324 from becoming smaller than the thickness of base 14.

As in Embodiment 1 described above, first pressing surface 344 refers to an entire surface on the inward side from first outer surface 342 of first fixing component 340, instead of referring only to a surface that is in direct contact with base 14. Similarly, second pressing surface 324 refers to an entire surface on the inward side from second inner surface 322 of second through-hole 326 of second fixing component 320, instead of referring only to a surface that is in direct contact with base 14.

With the configuration described thus far, semiconductor light-emitting device 10 can be disposed in a manner that second fixing component 320 covers the surface of semiconductor light-emitting device 10 except for an end surface on the side where emission light 91 is emitted. Moreover, first main surface 18a of base 14 contacts first pressing surface 344 of first fixing component 340, and first outer surface 342 of first fixing component 340 contacts second inner surface 322 of second fixing component 320. With this, a thermal dissipation area of the thermal dissipation path from semiconductor light-emitting device 10 to second fixing component 320 can be increased without increasing the size of light source device 301 in the optical axis direction. In the present embodiment, electric power can be supplied to semiconductor light-emitting device 10 using second through-hole 326 of second fixing component 320. Moreover, emission light 91 from semiconductor light-emitting device 10 can be easily extracted to the outside using first through-hole 346 of first fixing component 340. With this configuration, light source device 301 can be easily formed, and the heat generated by semiconductor light-emitting device 10 can be efficiently dissipated to the external thermal dissipation component without loss of electrical and optical performance of semiconductor light-emitting device 10.

Hereinafter, the configuration and function of light source device 301 are described more specifically. Note that the following description includes non-essential points.

First fixing component 340 is a nearly cylindrical member that is formed using a highly thermally conductive metal material, such as iron. First through-hole 346 that allows emission light from semiconductor light-emitting device 10 to pass through is provided in a central region of first fixing component 340. Moreover, first thread 342a is formed as a male thread on a side surface of an outermost surface of first fixing component 340. Furthermore, first pressing surface 344 that is flat is formed on an end surface 341a of first fixing component 340 on the side that contacts semiconductor light-emitting device 10.

Recess 327 is formed in second fixing component 320 on the side closer to main surface 321a of second base stand 321 that is formed using a highly thermally conductive metal material, such as copper. Opening 325 in which lead pin 17 of semiconductor light-emitting device 10 is to be disposed is formed near a central region of second pressing surface 324 that is the bottom surface of recess 327. Moreover, second thread 322a is formed as, for example, a female thread on second inner surface 322 of second through-hole 326 corresponding to the side surface of recess 327. Second thread 322a is formed to threadably join to first thread 342a of first fixing component 340. More specifically, first thread 342a and second thread 322a are formed to engage with each other. In other words, the male thread portion included in first fixing component 340 engages with the female thread portion included in second fixing component 320.

In the present embodiment, direct contact between second main surface 18b of base 14 of semiconductor light-emitting device 10 and second fixing component 320 having recess 327 enables semiconductor light-emitting device 10 to be thermally connected to second fixing component 320. Moreover, direct contact between the outer region of first main surface 18a and first pressing surface 344 of first fixing component 340 enables semiconductor light-emitting device 10 to be thermally connected to first fixing component 340. Furthermore, direct contact between first outer surface 342 and second inner surface 322 enables first fixing component 340 to be thermally connected to second fixing component 320. To be more specific, first fixing component 340 and second fixing component 320 are thermally connected via contact portion 332 between first outer surface 342 and second inner surface 322. Moreover, second fixing component 320 is thermally connected to external thermal dissipation component 89.

With the configuration described thus far, a part of heat generated by semiconductor light-emitting element 11 is dissipated to external thermal dissipation component 89 through thermal dissipation paths 371 and 372 from second main surface 18b of base 14 to second fixing component 320. Moreover, another part of the heat generated by semiconductor light-emitting element 11 is dissipated to external thermal dissipation component 89 from first main surface 18a of base 14 to first fixing component 340, and then, through thermal dissipation paths 373 and 374 leading to second fixing component 320. Here, since second fixing component 320 is formed in a manner to cover semiconductor light-emitting device 10, thermal dissipation paths 373 and 374 from base 14 to second fixing component 320 via first fixing component 340 can be shorter than the case of light source device 1 according to Embodiment 1. Furthermore, in the present embodiment, an area of contact portion 332 between first fixing component 340 and second fixing component 320, that is, an area of contact portion 332 between first outer surface 342 and second inner surface 322, can be increased without increasing the size of light source device 301 in the optical axis direction. As described thus far, the heat generated by semiconductor light-emitting element 11 is transferred rapidly to second fixing component 320, which has a large thermal capacity, via the two thermal dissipation paths from base 14, according to the present embodiment. This can suppress temperature increase of semiconductor light-emitting element 11.

It should be noted that the light source device according to the present embodiment may include second fixing component 320 having second pressing surface 324 that includes a base recess similar to base recess 23 according to Variation 1 of Embodiment 1 shown in FIG. 6. Moreover, as in the case of the optical device according to Variation 2 of Embodiment 1 shown in FIG. 8A, the base recess may include protrusion 23A to prevent semiconductor light-emitting device 10b from rotating.

Next, an example of a light source device in which light source device 301 according to the present embodiment is combined with wavelength conversion member 465 is described, with reference to the drawings.

Figure 18:
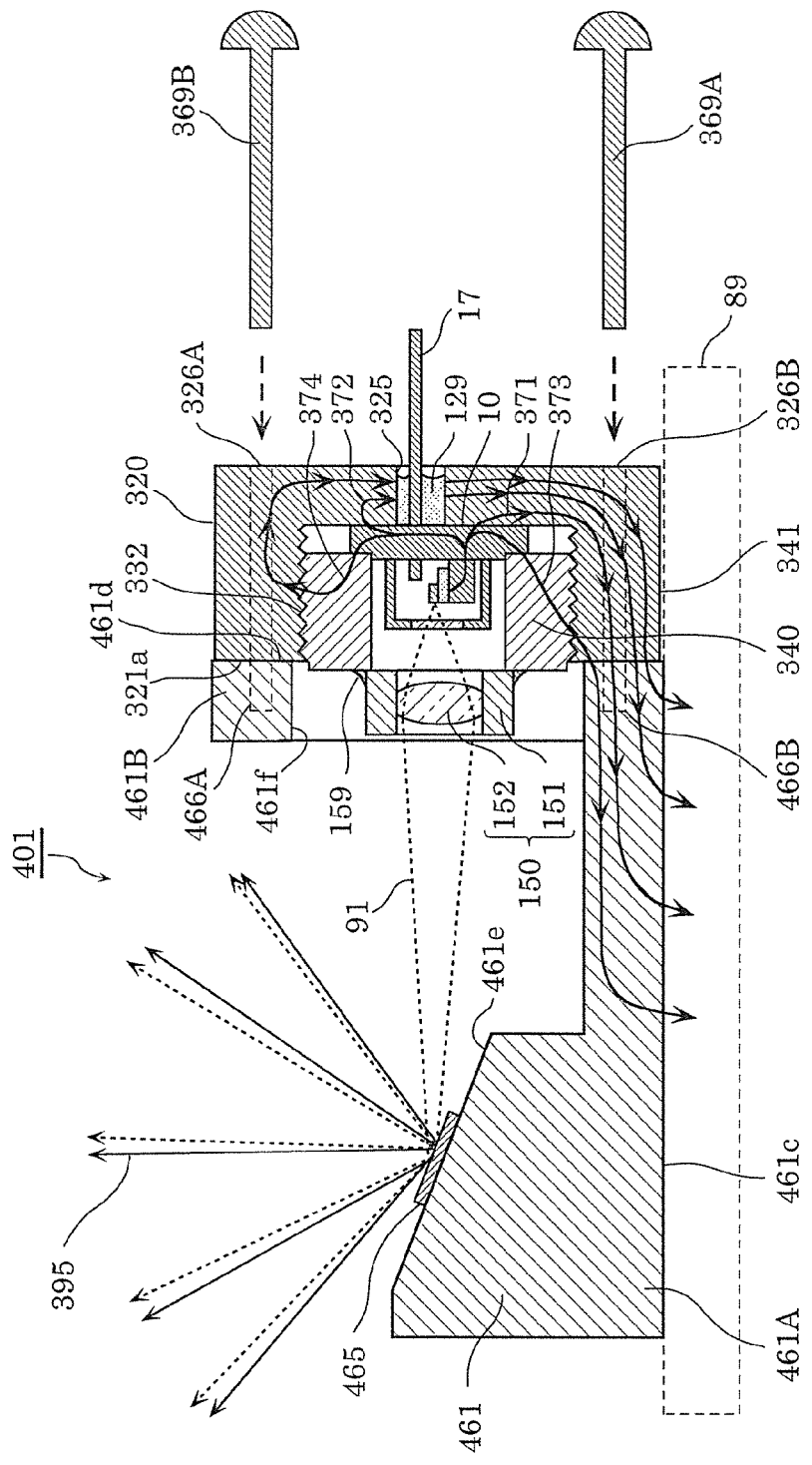
FIG. 18 is a schematic cross-sectional view showing a configuration of a light source device in which the light source device according to Embodiment 4 is combined with a wavelength conversion member.
Figure 19:
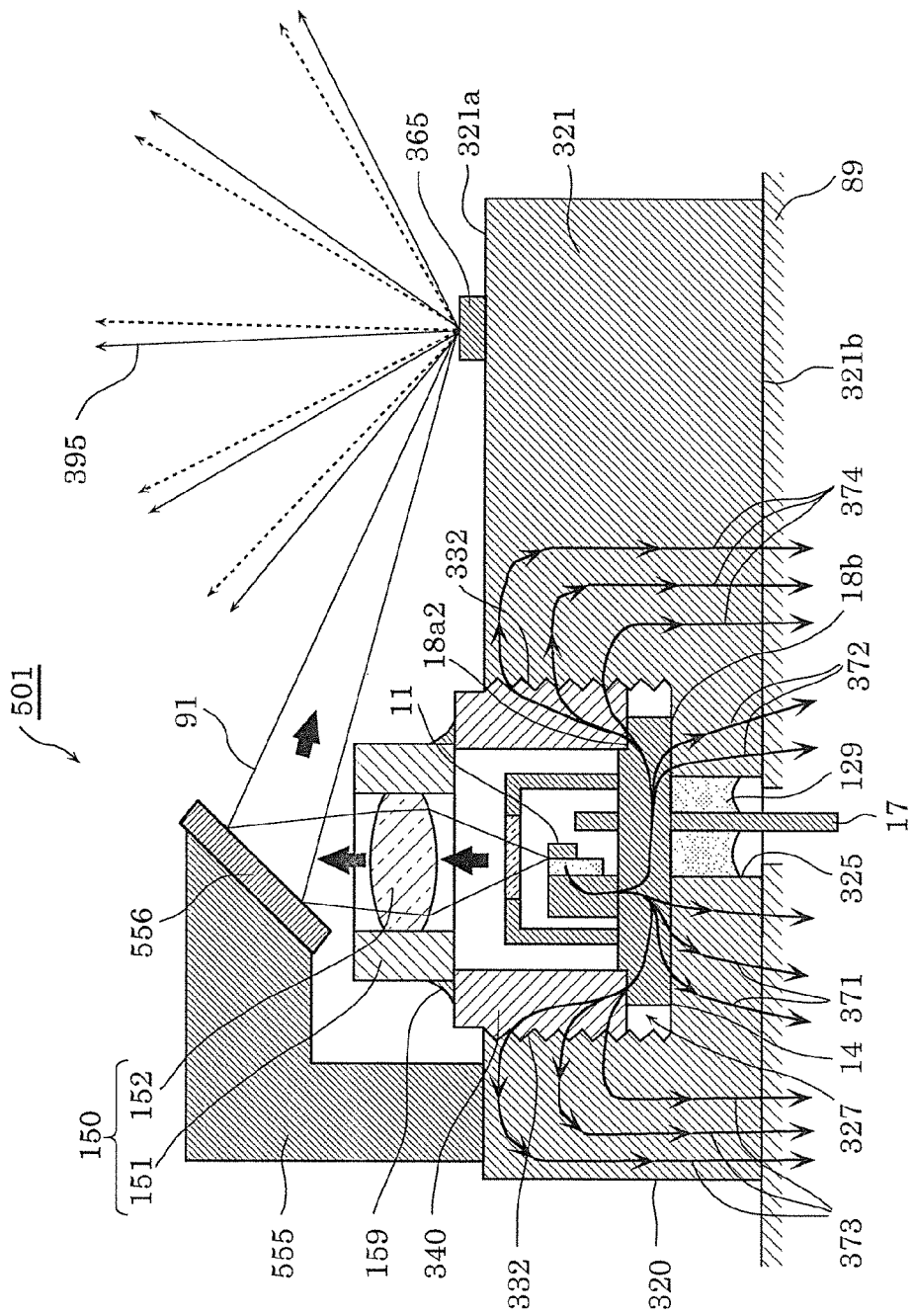
FIG. 19 is a schematic cross-sectional view showing a configuration of a light source device in which the light source device according to Embodiment 4 is combined with a wavelength conversion member.
Figure 20:
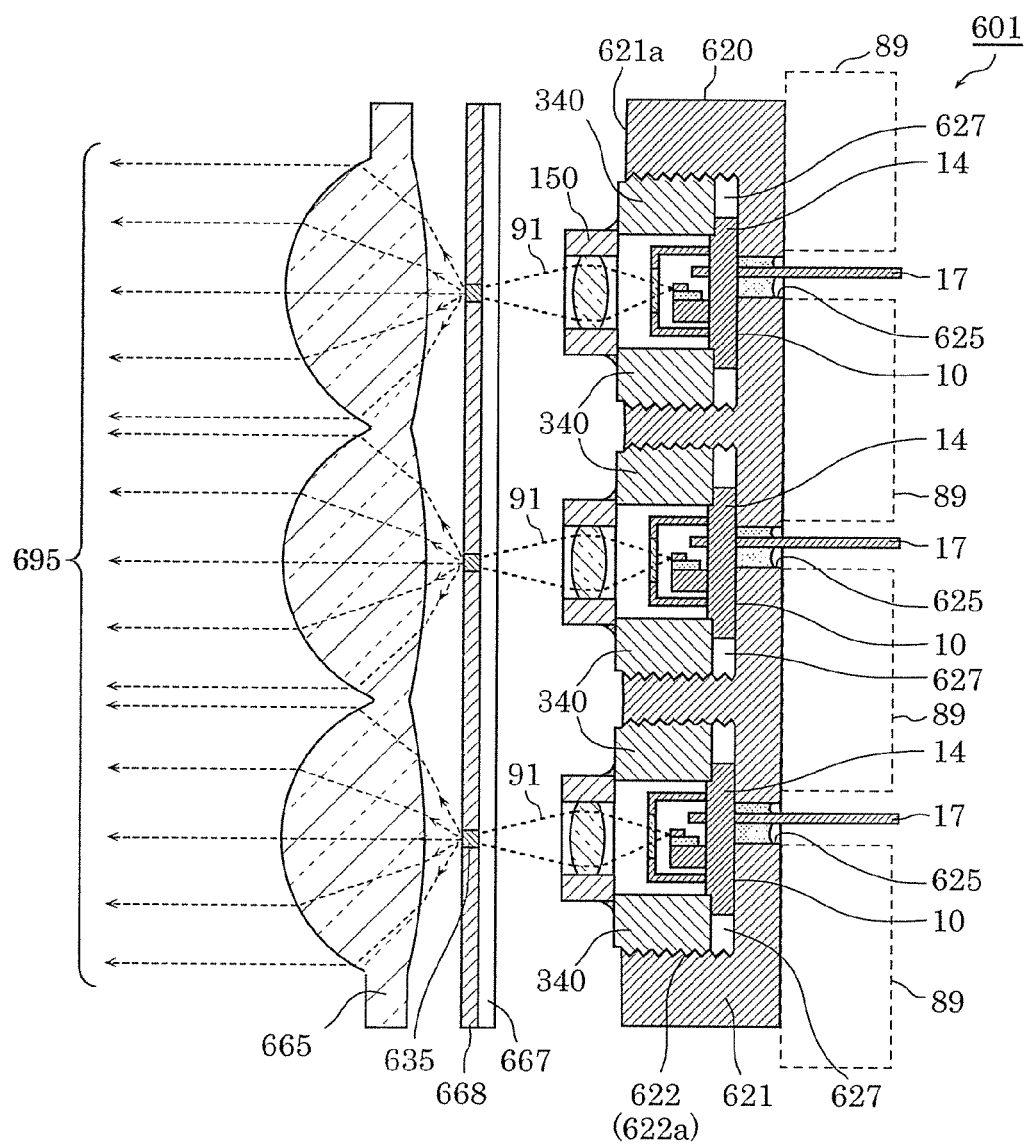
FIG. 20 is a schematic cross-sectional view showing a configuration of a light source device in which the light source device according to Embodiment 4 is combined with a wavelength conversion member.

FIG. 18, FIG. 19, and FIG. 20 are schematic cross-sectional views showing respective configurations of light source devices 401, 501, and 601 in each of which light source device 301 according to the present embodiment is combined with wavelength conversion member 465.

Light source device 401 shown in FIG. 18 has a configuration in which light source device 301 is attached to housing 461 provided with wavelength conversion member 465. Housing 461 includes the following: mount 461A having first flat surface 461c; and attachment portion 461B having second flat surface 461d that is formed perpendicular to first flat surface 461c. Mount 461A and attachment portion 461B may be integrally molded using, for example, an aluminum alloy. Moreover, oblique surface 461e on which wavelength conversion member 465 is fixed is formed on a surface (on the upper side as viewed in FIG. 18) opposite to first flat surface 461c of mount 461A. Furthermore, opening 461f that allows emission light 91 from light source device 301 to pass through is formed in attachment portion 461B.

Moreover, light source device 401 includes lens module 150 in which lens 152 is mounted on holder 151. Lens module 150 is attached, by means of adhesive portion 159, to an end surface of first fixing component 340 on the side where emission light 91 is emitted. Furthermore, second fixing component 320 includes through-holes 326A and 326B, and is fixed to second flat surface 461d by means of threads 369A and 369B and screw holes 466A and 466B.

With the configuration described above, emission light 91 from semiconductor light-emitting device 10 is collected by lens 152, and after being collected, enters wavelength conversion member 465. A part of emission light 91 entering wavelength conversion member 465 is converted into fluorescence that is different in wavelength from emission light 91. Then, this light is emitted as the fluorescence from light source device 401. A part of heat generated by semiconductor light-emitting device 10 is dissipated through thermal dissipation paths 371 and 372 that runs to second fixing component 320 and then reaches housing 461 after passing through second flat surface 461d. Moreover, another part of the heat generated by semiconductor light-emitting device 10 is dissipated through thermal dissipation paths 373 and 374 that runs to first fixing component 340 and second fixing component 320 and then reaches housing 461 after passing through second flat surface 461d. The heat transferred to housing 461 is dissipated from first flat surface 461c to external thermal dissipation component 89.

With the configuration of light source device 401 described thus far, the light emitted from semiconductor light-emitting device 10 is converted by wavelength conversion member 465 which then emits the emission light. Thus, the heat generated by semiconductor light-emitting device 10 can be effectively dissipated to the outside.

Next, light source device 501 shown in FIG. 19 is described. In light source device 501 shown in FIG. 19, semiconductor light-emitting device 10 is disposed in recess 327 of second fixing component 320 and wavelength conversion member 365 is disposed on main surface 321a of second fixing component 320. With this configuration of light source device 501, light emitted from semiconductor light-emitting device 10 is converted by wavelength conversion member 365 which then emits the emission light. Thus, a housing for fixing second fixing component 320 and wavelength conversion member 365 is not necessary. This can simplify the configuration of light source device 501.

To be more specific, light source device 501 includes lens module 150 in which lens 152 is mounted on holder 151. Lens module 150 is attached, by means of adhesive portion 159, to an end surface of first fixing component 340 on the light emitting side (an end surface on the upper side as viewed in FIG. 19). On an optical path of emission light 91 from lens 152, reflective mirror 556 fixed to mirror holding component 555 is disposed. Mirror holding component 555 is fixed to second fixing component 320. Moreover, wavelength conversion member 365 including a phosphor is fixed on main surface 321a of second base stand 321 of second fixing component 320. Mirror holding component 555 is fixed to second fixing component 320 at a position and an angle so that the emission light from semiconductor light-emitting device 10 enters wavelength conversion member 365 at a desired angle.

In light source device 501, emission light emitted from semiconductor light-emitting element 11 of semiconductor light-emitting device 10 is collected by lens 152 and reflected by reflective mirror 556. Then, the light enters wavelength conversion member 365. After entering wavelength conversion member 365, a part of emission light 91 is scattered to become scattering light and another part is converted into fluorescence by a phosphor. Then, emission light 395 in which the scattering light and the fluorescence are mixed is emitted from light source device 501.

To operate in this way, light source device 501 includes the following paths: thermal dissipation paths 371 and 372 from base 14 of semiconductor light-emitting device 10 directly to second fixing component 320; and thermal dissipation paths 373 and 374 from base 14 to second fixing component 320 via first fixing component 340. Through these thermal dissipation paths, the heat generated by semiconductor light-emitting element 11 is effectively dissipated to second fixing component 320. Then, the heat is dissipated to external thermal dissipation component 89 from main surface 321b that is the back side of main surface 321a of second fixing component 320. With the configuration described above, the heat generated by semiconductor light-emitting element 11 can be dissipated to the external thermal dissipation component through a plurality of short thermal dissipation paths. This can suppress temperature increase of semiconductor light-emitting element 11 during operation.

Next, light source device 601 shown in FIG. 20 is described. In light source device 601 shown in FIG. 20, a plurality of semiconductor light-emitting devices 10 are disposed in second fixing component 620 that includes second base stand 621 in which a plurality of recesses 627 are formed. Each of the plurality of recesses 627 includes second inner surface 622. Moreover, second thread 622a is formed in second inner surface 622. The plurality of semiconductor light-emitting devices 10 are fixed by a plurality of first fixing components 340, respectively. With this configuration, a plurality of emission light beams can be emitted from second fixing component 620. Moreover, the heat generated by the plurality of semiconductor light-emitting devices 10 can be effectively dissipated. On this account, high-power emission light can be emitted from light source device 601.

To be more specific, the plurality of recesses 627 are formed in main surface 621a of second base stand 621 included in second fixing component 620. Opening 625 is provided on a bottom surface of each of the plurality of recesses 627. Each of semiconductor light-emitting devices 10 is disposed in a corresponding one of recesses 627. Each of bases 14 of semiconductor light-emitting devices 10 is held and fixed between first fixing component 340 and second fixing component 620. Moreover, main surface 621b that is the back side of main surface 621a of second fixing component 620 is connected to exposure thermal dissipation component 89, such as a thermal dissipation fin. With this, heat generated by semiconductor light-emitting device 10 can be effectively dissipated to external thermal dissipation component 89.

Furthermore, lens module 150 may be attached to an end surface of first fixing component 340 of light source device 601 on the side where emission light 91 is emitted. Moreover, emission light 91 from the plurality of semiconductor light-emitting devices 10 may be collected by the plurality of lens modules 150. Here, a plurality of wavelength conversion members 635 may be disposed at respective positions that are irradiated with emission light 91 collected by lens modules 150. For example, light blocking mask 668 may be provided on transparent substrate 667, and wavelength conversion members 635 may be disposed in openings of light blocking mask 668. Furthermore, lens array 665 corresponding to the plurality of wavelength conversion members 635 may be provided. This can form a light projection device that emits emission light 695 that is high in power and directivity.

It should be noted that, in each of the optical devices shown in FIG. 16 to FIG. 20, an end surface opposite to first pressing surface 344 of first fixing component 340 projects outward from main surface 321a of second fixing component 320. However, the configuration of the optical device according to the present embodiment is not limited to this. To be more specific, the end surface opposite to first pressing surface 344 may be disposed inside second fixing component 320, or more specifically, inside recess 327. With this configuration, main surface 321a is positioned at an outermost portion. Thus, optical components, for example, can be disposed more freely on the main surface 321a side.

Variation of Embodiment 4

Hereinafter, a light source device according to Variation of Embodiment 4 is described. The light source device according to the present variation is different from light source device 301 according to Embodiment 4 in that a first fixing component has a different configuration from first fixing component 340. The following mainly describes differences between the light source device according to the present variation and light source device 301 according to Embodiment 4, with reference to the drawing.

Figure 21:
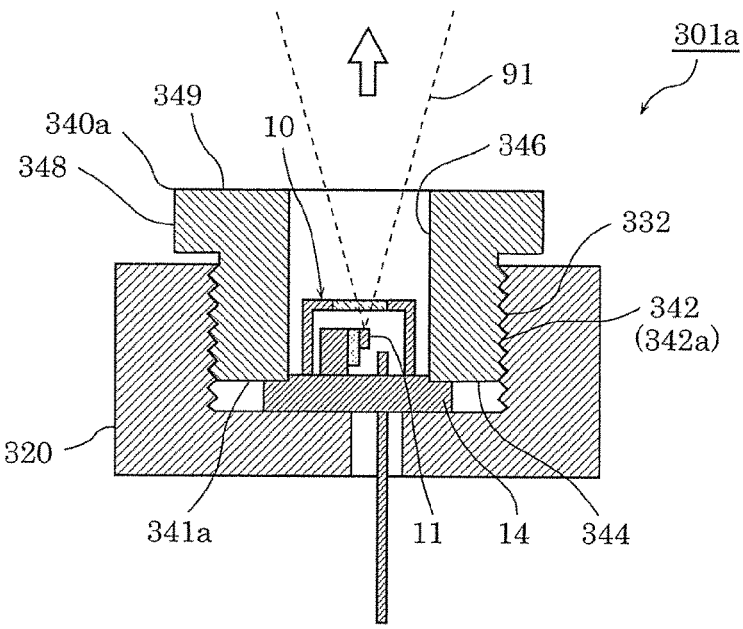
FIG. 21 is a schematic cross-sectional view showing a configuration of a light source device according to Variation of Embodiment 4.

FIG. 21 is a schematic cross-sectional view showing a configuration of light source device 301a according to the present variation.

As shown in FIG. 21, first through-hole 346 that allows emission light from semiconductor light-emitting device 10 to pass through is provided in a central region of first fixing component 340a according to the present variation. Moreover, first pressing surface 344 that is flat is formed on end surface 341a of first fixing component 340a on the side that contacts semiconductor light-emitting device 10. Light is emitted from end surface 349 that is opposite to end surface 341a of first fixing component 340a. Furthermore, a side surface (that connects end surface 341a and end surface 349) of first fixing component 340a includes, on the side closer to end surface 349, holding portion 348 for holding second fixing component 320 when first fixing component 340a is attached to second fixing component 320. This can enhance efficiency of operation performed to attach first fixing component 340a to second fixing component 320.

Embodiment 5

Hereinafter, a light source device according to Embodiment 5 is described. The light source device according to the present embodiment is different from the embodiments described above in that a first fixing component includes the following: an intermediate barrel that is nearly cylindrical and disposed on a first main surface of a base; and a third fixing component that is disposed outside the intermediate barrel and has a first outer surface. The following mainly describes the first fixing component of the light source device according to the present embodiment, with reference to the drawings.

Figure 22:
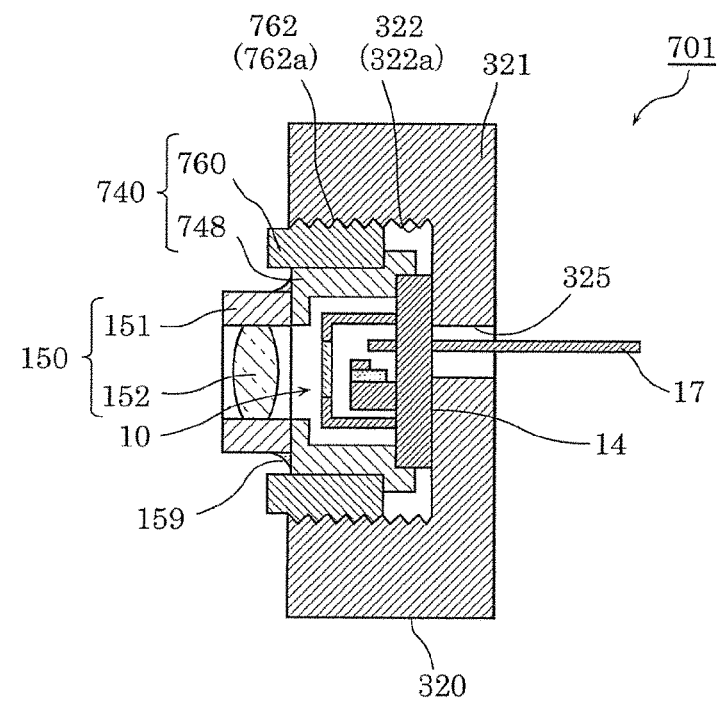
FIG. 22 is a schematic cross-sectional view showing a configuration of a light source device according to Embodiment 5.

FIG. 22 is a schematic cross-sectional view showing a configuration of light source device 701 according to the present embodiment.

Figure 23:
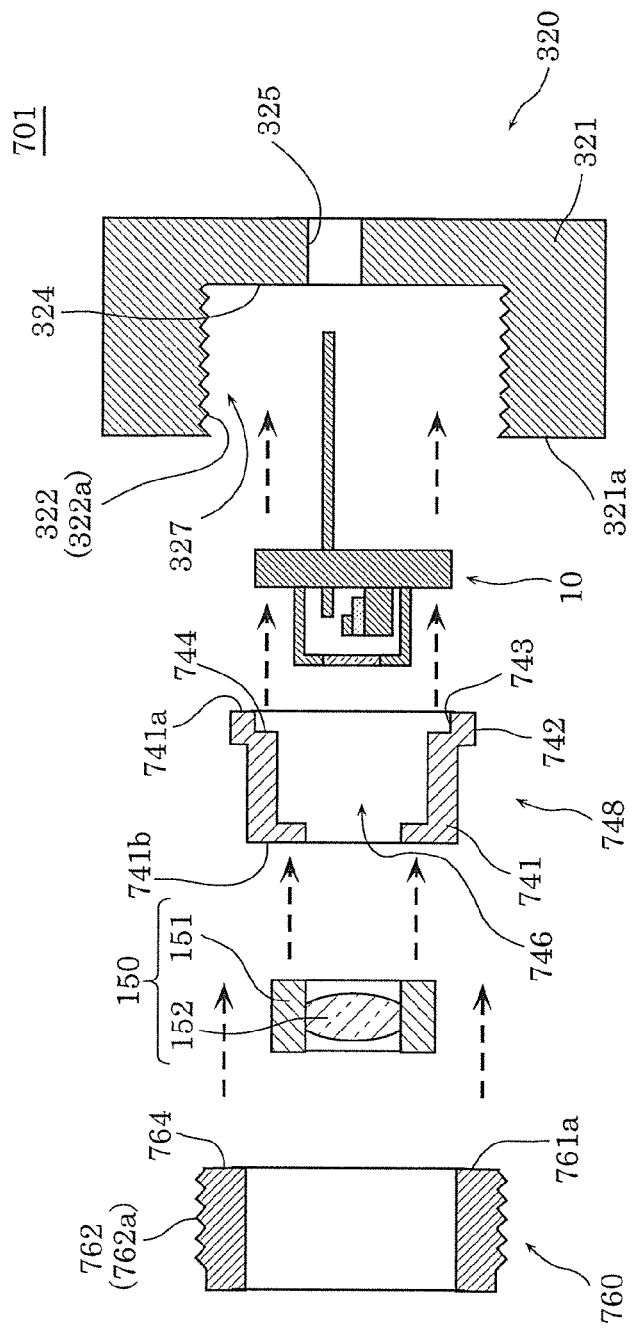
FIG. 23 is an exploded schematic cross-sectional view showing a configuration of the light source device according to Embodiment 5.

FIG. 23 is an exploded schematic cross-sectional view showing a configuration of light source device 701 according to the present embodiment.

As shown in FIG. 22 and FIG. 23, light source device 701 includes semiconductor light-emitting device 10, first fixing component 740, and second fixing component 320. Also in the present embodiment, semiconductor light-emitting device 10 is fixed since base 14 of semiconductor light-emitting device 10 is held between first fixing component 740 and second fixing component 320.

First fixing component 740 according to the present embodiment includes the following: intermediate barrel 748 disposed on first main surface 18a of base 14; and third fixing component 760 disposed outside intermediate barrel 748.

Third fixing component 760 is a nearly cylindrical member and includes first outer surface 762 around a perimeter of third fixing component 760. First thread 762a is formed in first outer surface 762 to engage with second inner surface 322 of second fixing component 320. Moreover, an end surface of third fixing component 760 (an end surface of light source device 701 in the optical axis direction) includes end surface 761a which contacts intermediate barrel 748 and which has third pressing surface 764 that is flat.

Intermediate barrel 748 is a nearly cylindrical member and interposed between third fixing component 760 and base 14 of semiconductor light-emitting device 10. Intermediate barrel 748 is formed using a highly thermally conductive material, such as iron or copper. Moreover, intermediate barrel 748 includes flange 742 and intermediate base stand 741 that has first through-hole 746 in a central region. In light source device 701 according to the present embodiment, semiconductor light-emitting device 10 is fixed to second fixing component 320 with third fixing component 760 via intermediate barrel 748 described above. Thus, even when semiconductor light-emitting device 10 is fixed by the engagement between second fixing component 320 and third fixing component 760 as in the present embodiment, base 14 of semiconductor light-emitting device 10 can be prevented from contacting third fixing component 760 that rotates. As a result, even when semiconductor light-emitting device 10 is applied with rotational pressure, displacement of semiconductor light-emitting device 10 can be suppressed.

Hereinafter, the configuration and advantageous effect of light source device 701 is described. Note that the following description includes non-essential points.

Light source device 701 includes lens module 150 in which lens 152 is mounted on holder 151. Here, a method of manufacturing light source device 701 is described, with reference to FIG. 23. Firstly, semiconductor light-emitting device 10 is mounted on intermediate barrel 748. Intermediate base stand 741 includes end surface 741a, which is first pressing surface 744, on the side closer to base 14. Recess 743 is formed in a central region of first recess 744. Base 14 is disposed into recess 743. Semiconductor light-emitting device 10 is mounted on recess 743. Then, an optical position of lens module 150 is adjusted and, in this adjusted state, firmly fixed to end surface 741b that is opposite to (or, that is on the left-hand side of, as viewed in FIG. 23) end surface 741a of intermediate barrel 748. Here, lens module 150 is fixed by means of adhesive portion 159 formed through, for example, laser welding.

Semiconductor light-emitting device 10, intermediate barrel 748, and lens module 150 are integrally formed in this way, and are fixed to recess 327 of second fixing component 320 using first fixing component 340. Here, with the application of pressure to flange 742 of intermediate barrel 748 by third pressing surface 764 of second fixing component 760, semiconductor light-emitting device 10 is fixed.

It should be noted that the pressing surface of first fixing component 740 mentioned in the present embodiment refers to both first pressing surface 744 and third pressing surface 764.

With the configuration described above, heat generated by semiconductor light-emitting device 10 of light source device 701 can be effectively dissipated to second fixing component 320. Moreover, intermediate barrel 748 can be disposed to suppress position change relative to semiconductor light-emitting device 10 when fixing operation is performed. Thus, even when an optical component, such as lens module 150 described above, is disposed in intermediate barrel 748, the position change relative to semiconductor light-emitting device 10 can be suppressed. This can prevent light source device 701 from deteriorating in optical characteristics.

Embodiment 6

Hereinafter, a light projection device according to Embodiment 6 is described. The light projection device according to the present embodiment includes light source device 201 according to Embodiment 2. The following describes the light projection device according to the present embodiment, with reference to the drawing.

Figure 24:
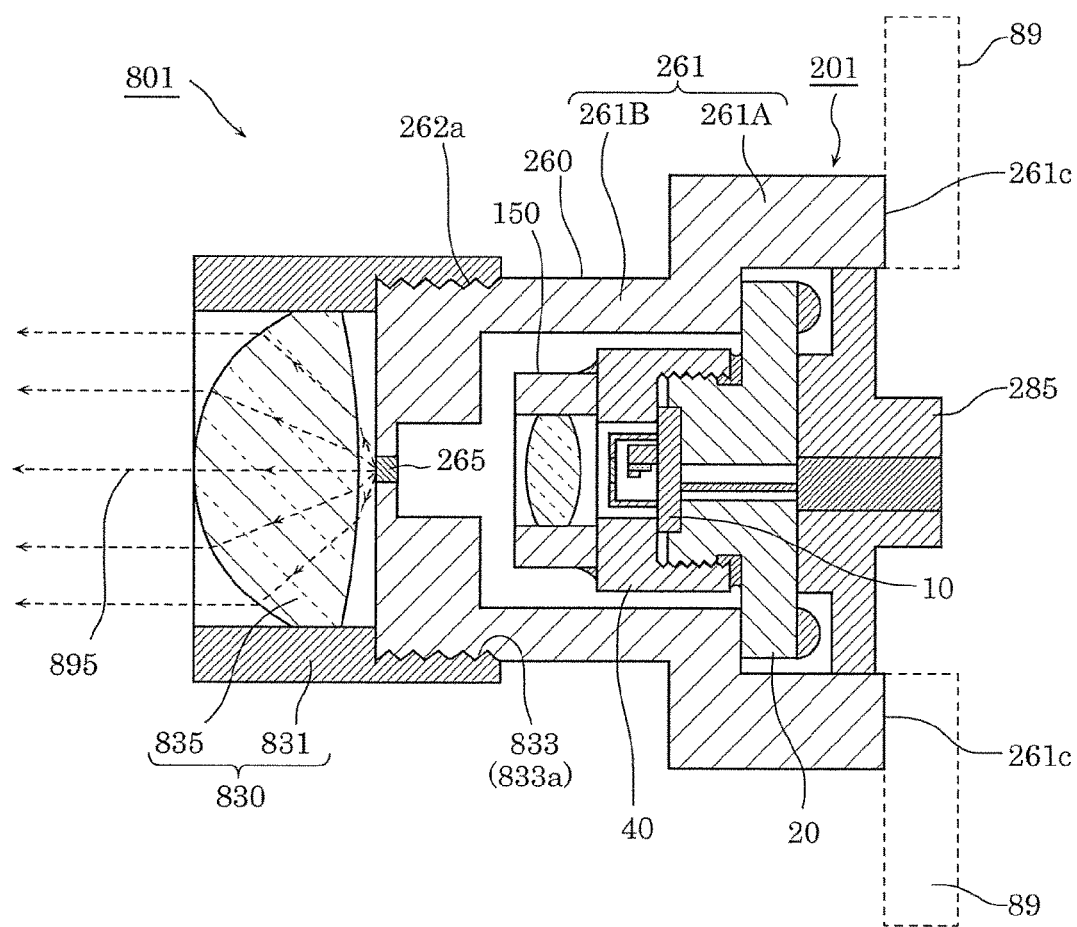
FIG. 24 is a schematic cross-sectional view showing a configuration of a light projection device according to Embodiment 6.

FIG. 24 is a schematic cross-sectional view showing a configuration of light projection device 801 according to the present embodiment.

As shown in FIG. 24, light projection device 801 according to the present embodiment includes light source device 201 and optical element module 830.

In the present embodiment, thread 262a is formed in barrel 261B of housing 260 of light source device 201. Optical element module 830 is threadably joined to barrel 261B. Optical element module 830 includes the following: barrel 831 that is nearly cylindrical; and lens 835 that is disposed inside barrel 831 and has a high numerical aperture. With this, light from light source device 201 can be emitted as emission light 895 that is, for example, parallel light. In the present embodiment, barrel 831 is a member formed using, for example, an iron alloy and includes recess 833. Moreover, thread 833a is formed in an inner wall of recess 833. With this configuration, optical element module 830 can be threadably joined to housing 260 via thread 262a and thread 833a.

With the configuration described thus far, light projection device 801 according to the present embodiment can project, through optical element module 830, emission light generated by wavelength conversion member 265 of light source device 201.

Embodiment 7

Hereinafter, a light projection device according to Embodiment 7 is described. The light projection device according to the present embodiment includes light source device 501 according to Embodiment 4. The following describes the light projection device according to the present embodiment, with reference to the drawing.

Figure 25:
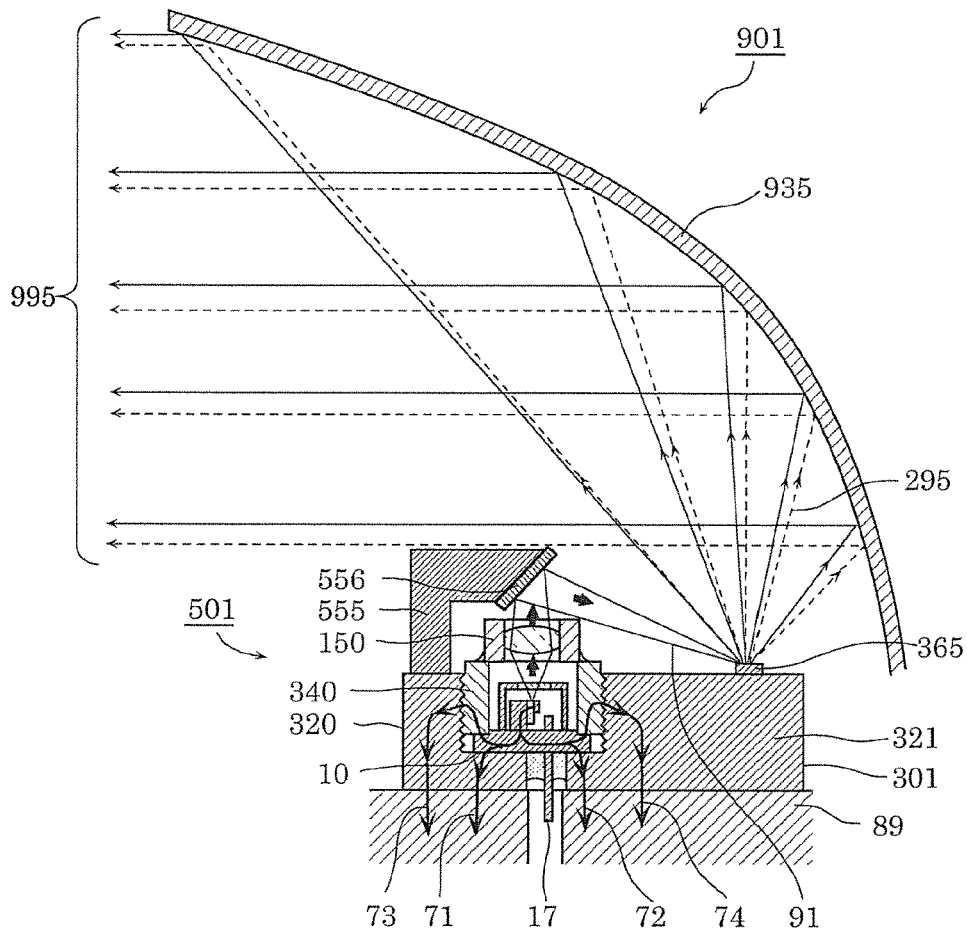
FIG. 25 is a schematic cross-sectional view showing a configuration of a light projection device according to Embodiment 7.
Figure 26:
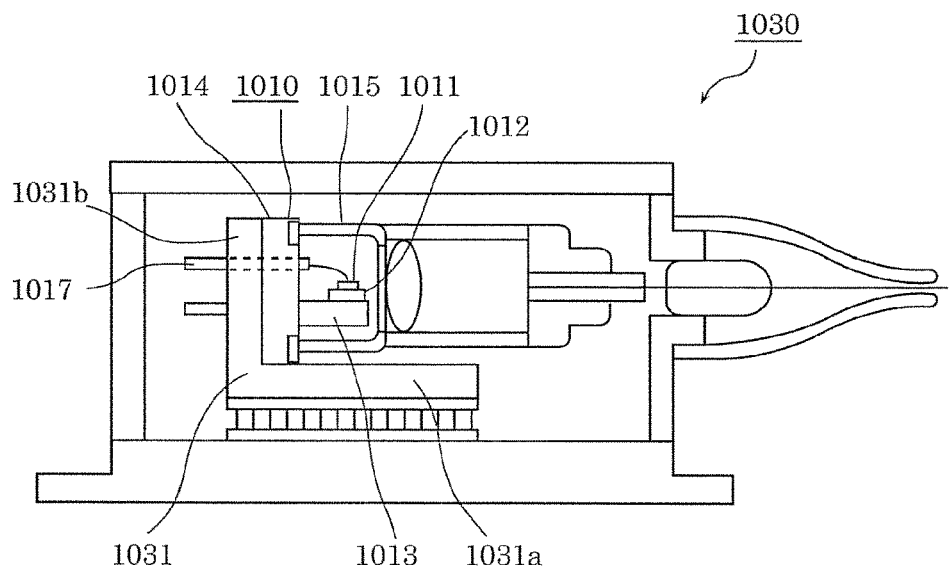
FIG. 26 is a schematic cross-sectional view showing a configuration of a conventional light source device.

FIG. 25 is a schematic cross-sectional view showing a configuration of light projection device 901 according to the present embodiment.

As shown in FIG. 25, light projection device 901 according to the present embodiment includes light source device 501 and reflector 935.

Light projection device 901 shown in FIG. 25 includes the following: light source device 501; and reflector 935 that is disposed on an optical path of emission light from light source device 501 (an optical path above wavelength conversion member 365 as viewed in FIG. 25).

In the present embodiment, reflector 935 is a reflective member that includes a paraboloidal reflecting surface having a focus on wavelength conversion member 365.

With this configuration, emission light 295 emitted from light source device 501 is reflected by reflector 935 and converted into emission light 995 that is nearly parallel light. In this way, with light source device 501 according to Embodiment 4, the light projection device including semiconductor light-emitting device 10 that is excellent in thermal dissipation performance can be provided.

Other Variations

Although the light source device according to the present disclosure in an aspect or aspects has been described by way of Embodiments and Variations above, it should be obvious that the present disclosure is not limited to Embodiments and Variations described above. Other embodiments implemented through various changes and modifications conceived by a person of ordinary skill in the art or through a combination of the structural elements or functions in different embodiments and variations described above may be included in the scope in an aspect or aspects according to the present disclosure, unless such changes, modifications, and combination depart from the scope of the present disclosure.

For example, the first fixing component and the second fixing component threadably join together in the above embodiments and variations. However, the manner in which the first fixing component and the second fixing component engage with each other is not limited to this. For instance, the first inner surface of the first fixing component and the second outer surface of the second fixing component may be smooth cylindrical surfaces having nearly the same diameter. In this case, by pressing the first fixing component against the second fixing component, the first fixing component and the second fixing component can engage with each other. Similarly, the first outer surface of the first fixing component and the second inner surface of the second fixing component may be smooth cylindrical surfaces having nearly the same diameter.

Moreover, in the above embodiments and variations, the base increases in diameter or produces a recess on the surface, by the application of pressure. However, this increase or the recess does not need to appear on the entire perimeter or the entire surface. In accordance with the shapes and accuracy of the first fixing component and the second fixing component, the thermal resistance can be effectively reduced even when the increase or the recess appears only on a part of the perimeter or a part of the surface.

Furthermore, in the above embodiments and variations, transparent window 16 in semiconductor light-emitting device 10 is formed using, for example, a glass with an antireflective coating. However, transparent window 16 with a lens function can be used. With this configuration, the semiconductor light-emitting device and the light source device can be more easily manufactured because the semiconductor light-emitting device has the same function as lens 152.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

According to the present disclosure, since the heat generated by the semiconductor light-emitting device included in the light source device can be effectively dissipated, the semiconductor light-emitting device can be prevented from deteriorating in characteristics. Thus, the present disclosure can be widely used for various optical devices, such as a light source device and a light projection device that includes a light source device.

What is claimed is:

1. A light source device, comprising:
a semiconductor light-emitting device which includes (i) a base that is in a shape of a flat plate and has a first main surface on a first side and a second main surface on a second side opposite to the first main surface, and (ii) a semiconductor light-emitting element that is disposed on the first side and thermally connected to the base;
a first fixing component which has (i) a first pressing surface that presses the first main surface toward the second main surface and (ii) a first through-hole passing through the first fixing component in a direction that crosses the first main surface; and
a second fixing component which has (i) a second pressing surface that presses the second main surface toward the first main surface and (ii) a second through-hole passing through the second fixing component in a direction that crosses the second main surface,
wherein the base is fixed between the first pressing surface and the second pressing surface by one of (i) an engagement, on the second side, between a first inner surface surrounding the first through-hole of the first fixing component and a second outer surface of the second fixing component and (ii) an engagement, on the first side, between a second inner surface surrounding the second through-hole of the second fixing component and a first outer surface of the first fixing component,
a distance between the first pressing surface and the second pressing surface is smaller than or equal to a thickness of the base, and a void is formed lateral to the base between the first pressing surface and the second pressing surface,
a perimeter of the first fixing component is encompassed by a perimeter of the second fixing component in a plan view of the first main surface, and
the semiconductor light-emitting element is disposed in a manner that emission light from the semiconductor light-emitting element is emitted in a direction from the first main surface to the first fixing component.

2. The light source device according to claim 1,
wherein the base is fixed between the first pressing surface and the second pressing surface by the engagement, on the first side, between the second inner surface surrounding the second through-hole of the second fixing component and the first outer surface of the first fixing component.

3. The light source device according to claim 1,
wherein the second fixing component is thermally connected to an external thermal dissipation component.

4. The light source device according to claim 3,
wherein the second fixing component is connected to the external thermal dissipation component in a manner to contact the external thermal dissipation component.

5. The light source device according to claim 1,
wherein a contact portion between the first fixing component and the second fixing component is in parallel with a direction that crosses the first main surface of the base.

6. The light source device according to claim 1,
wherein one of the first fixing component and the second fixing component includes a male thread portion,
an other one of the first fixing component and the second fixing component includes a female thread portion, and
the male thread portion and the female thread portion engage with each other.

7. The light source device according to claim 1,
wherein the void includes a filler that contains a metallic element.

8. The light source device according to claim 1,
wherein the second fixing component includes a base recess in the second pressing surface, and
the base is disposed in the base recess.

9. The light source device according to claim 1,
wherein one of the first main surface and the first fixing component includes a first projection,
an other one of the first main surface and the first fixing component includes a first depression, and
the first projection and the first depression engage with each other.

10. The light source device according to claim 1,
wherein one of the second main surface and the second fixing component includes a second projection,
an other one of the second main surface and the second fixing component includes a second depression, and
the second projection and the second depression engage with each other.

11. The light source device according to claim 1,
wherein one of a proof stress and a yield point of a material used for forming the first fixing component is higher than a corresponding one of a proof stress and a yield point of a material used for forming the base.

12. The light source device according to claim 1,
wherein the base has, around an outer region of the first main surface, a recessed surface that is recessed from a central region of the first main surface and that contacts the first fixing component.

13. The light source device according to claim 1,
wherein the first fixing component includes: an intermediate barrel that is nearly cylindrical and disposed on the first main surface of the base; and a third fixing component that is disposed outside the intermediate barrel and has the first outer surface.

14. The light source device according to claim 1,
wherein the first fixing component includes a lens which the emission light enters.

15. The light source device according to claim 1, comprising:
a housing which is connected to the semiconductor light-emitting device via the second fixing component,
wherein the housing includes a wavelength conversion member which contains a phosphor.

16. The light source device according to claim 1,
wherein the second fixing component includes a wavelength conversion member which contains a phosphor.

17. The light source device according to claim 1,
wherein the semiconductor light-emitting device comprises a plurality of semiconductor light-emitting devices,
the first fixing component comprises a plurality of first fixing components, and
each of the plurality of semiconductor light-emitting devices is connected to the second fixing component via a corresponding one of the plurality of first fixing components.

18. The light source device according to claim 1,
wherein the semiconductor light-emitting element is a nitride semiconductor laser element.

19. A light projection device, comprising
the light source device according to claim 1.

20. The light projection device according to claim 19, comprising
a reflector which is disposed on an optical path of the emission light from the light source device.

* * * * *